United States Patent
Xiang et al.

(10) Patent No.: US 12,484,390 B2
(45) Date of Patent: Nov. 25, 2025

(54) LIGHT EMITTING SUBSTRATE AND PREPARATION METHOD THEREFOR, AND LIGHT EMITTING APPARATUS

(71) Applicants: Chengdu BOE Optoelectronics Technology Co., Ltd., Sichuan (CN); BOE Technology Group Co., Ltd., Beijing (CN)

(72) Inventors: Lian Xiang, Beijing (CN); Lu Li, Beijing (CN)

(73) Assignees: Chengdu BOE Optoelectronics Technology Co., Ltd., Sichuan (CN); Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 18/027,922

(22) PCT Filed: Apr. 21, 2022

(86) PCT No.: PCT/CN2022/088207
§ 371 (c)(1),
(2) Date: Mar. 22, 2023

(87) PCT Pub. No.: WO2023/201632
PCT Pub. Date: Oct. 26, 2023

(65) Prior Publication Data
US 2024/0315091 A1    Sep. 19, 2024

(51) Int. Cl.
*H10K 59/126*    (2023.01)
*H10K 50/00*    (2023.01)
(Continued)

(52) U.S. Cl.
CPC ....... *H10K 59/126* (2023.02); *H10K 59/1201* (2023.02); *H10K 59/122* (2023.02); *H10K 59/131* (2023.02)

(58) Field of Classification Search
CPC .............. H10K 59/122; H10K 59/126; H10K 59/1201; H10K 59/131; H10K 59/00; H10K 59/19; H10K 50/80
See application file for complete search history.

(56) References Cited

U.S. PATENT DOCUMENTS

| 11,144,168 B1 * | 10/2021 | Lin ...................... G06F 3/0448 |
| 2005/0168618 A1 * | 8/2005 | Okita .................... H10F 39/802 |
| | | 348/335 |

(Continued)

FOREIGN PATENT DOCUMENTS

| CN | 105428355 A | 3/2016 |
| CN | 107393906 A | 11/2017 |

(Continued)

*Primary Examiner* — Mohsen Ahmadi
(74) *Attorney, Agent, or Firm* — Ling Wu; Stephen Yang; Ling and Yang Intellectual Property

(57) ABSTRACT

A light emitting substrate, including: a base substrate (200), at least one light emitting element (10), at least one anti-static trace (15), and a ground trace (13). The base substrate (200) includes a display region (AA) and a peripheral region (BB) located on at least one side of the display region (AA). The at least one light emitting element (10) and the at least one anti-static trace (15) are located in the display region (AA), and the at least one anti-static trace (15) is configured to surround the at least one light emitting element (10). The ground trace (13) is located in the peripheral region (BB), and the ground trace (13) is electrically connected with the at least one anti-static trace (15).

17 Claims, 13 Drawing Sheets

(51) Int. Cl.
  *H10K 50/80*   (2023.01)
  *H10K 59/12*   (2023.01)
  *H10K 59/122*  (2023.01)
  *H10K 59/131*  (2023.01)
  *H10K 59/19*   (2023.01)

(56) References Cited

U.S. PATENT DOCUMENTS

| | | | | |
|---|---|---|---|---|
| 2011/0157071 | A1* | 6/2011 | Huang | G06F 3/0443 |
| | | | | 345/174 |
| 2012/0062486 | A1* | 3/2012 | Rho | G06F 3/0443 |
| | | | | 156/60 |
| 2012/0127095 | A1* | 5/2012 | Jun | G06F 3/0446 |
| | | | | 345/173 |
| 2017/0153729 | A1* | 6/2017 | Seo | G02F 1/133509 |
| 2017/0192319 | A1 | 7/2017 | Zhang et al. | |
| 2017/0277320 | A1* | 9/2017 | Choi | G06F 3/0446 |
| 2018/0166520 | A1 | 6/2018 | Kang et al. | |
| 2019/0363155 | A1 | 11/2019 | Xiao et al. | |
| 2020/0057521 | A1 | 2/2020 | Lee et al. | |
| 2020/0150807 | A1* | 5/2020 | Miyashita | G06F 3/0412 |
| 2020/0274111 | A1 | 8/2020 | Monestier et al. | |
| 2021/0225955 | A1* | 7/2021 | Yuan | G09G 3/006 |
| 2021/0373705 | A1* | 12/2021 | Lee | G06F 3/03545 |
| 2021/0406496 | A1* | 12/2021 | Tao | H01L 23/60 |
| 2022/0075483 | A1* | 3/2022 | Yan | G06F 3/0418 |
| 2022/0352101 | A1 | 11/2022 | Zhai | |

FOREIGN PATENT DOCUMENTS

| | | |
|---|---|---|
| CN | 108172697 A | 6/2018 |
| CN | 108957852 A | 12/2018 |
| CN | 109343285 A | 2/2019 |
| CN | 109390351 A | 2/2019 |
| CN | 110036336 A | 7/2019 |
| CN | 111149210 A | 5/2020 |
| CN | 213178174 U | 5/2021 |
| CN | 113178443 A | 7/2021 |
| CN | 113224103 A | 8/2021 |
| CN | 113725269 A | 11/2021 |
| CN | 114299873 A | 4/2022 |

* cited by examiner ic Light Emitting Diode (QLED) are active light emitting display devices and have advantages of self-illumination, a wide viewing angle, a high contrast ratio, low power consumption, an extremely high reaction speed, lightness and thinness, bendability, a low cost, etc.

SUMMARY

The following is a summary of subject matters described herein in detail. The summary is not intended to limit the protection scope of claims.

Embodiments of the present disclosure provide a light emitting substrate and a preparation method therefor, and a light emitting apparatus.

In one aspect, an embodiment of the present disclosure provides a light emitting substrate, including: a base substrate, at least one light emitting element, at least one anti-static trace, and a ground trace. The base substrate includes a display region and a peripheral region located on at least one side of the display region. The at least one light emitting element and the at least one anti-static trace are located in the display region. The at least one anti-static trace is configured to surround the at least one light emitting element. The ground trace is located in the peripheral region, and the ground trace is electrically connected with the at least one anti-static trace.

In some exemplary implementations, the at least one anti-static trace constitutes a mesh structure, the mesh structure includes at least one mesh, and the at least one mesh surrounds the at least one light emitting element.

In some exemplary implementations, adjacent anti-static traces in the display region constitute an integrated structure, or are electrically connected through a first connection electrode.

In some exemplary implementations, the anti-static trace includes: a first extension portion and a first connection portion connected to each other, an orthographic projection of the first extension portion on the base substrate being annular; the first connection portion of the anti-static trace and a first connection portion of another anti-static trace constitute an integrated structure, or the first connection portion of the anti-static trace is electrically connected with a first connection portion of another anti-static trace through the first connection electrode.

In some exemplary implementations, the first connection electrode is located on a side of the anti-static trace away from the base substrate.

In some exemplary implementations, the ground trace is electrically connected to the at least one anti-static trace through a second connection electrode.

In some exemplary implementations, the ground trace and the anti-static trace are of a same layer structure, and the second connection electrode is located on a side of the ground trace away from the base substrate.

In some exemplary implementations, the display region is further provided with a pixel definition layer having at least one pixel opening, and a portion of the light emitting element located at the pixel opening is used for emitting light; and an orthographic projection of the pixel definition layer on the base substrate covers an orthographic projection of the anti-static trace on the base substrate.

In some exemplary implementations, the light emitting element includes: a first electrode, a second electrode, and an organic light emitting layer arranged between the first electrode and the second electrode. The first electrode is located on a side of the organic light emitting layer close to the base substrate, the pixel opening of the pixel definition layer exposes at least a portion of the first electrode, the organic light emitting layer is in contact with the first electrode through the pixel opening, the second electrode is located on a side of the organic light emitting layer away from the base substrate, and the second electrode is in contact with the organic light emitting layer.

In some exemplary implementations, the light emitting substrate further includes: at least one first signal trace and at least one second signal trace, the first signal trace extending from the peripheral region to the display region and electrically connected to the first electrode of the at least one light emitting element; and the second signal trace being located in the peripheral region and electrically connected to the second electrode of the at least one light emitting element.

In some exemplary implementations, in the display region, the anti-static trace is located between the first signal trace and the light emitting element.

In some exemplary implementations, in the peripheral region, the ground trace is located between the second signal trace and the first signal trace.

In some exemplary implementations, the light emitting substrate further includes: a first conductive layer located on a side of the at least one light emitting element close to the base substrate, the first signal trace, the second signal trace, the anti-static trace and the ground trace being all located in the first conductive layer.

In some exemplary implementations, the light emitting substrate further includes: a first insulating layer located between the light emitting element and the first conductive layer, an orthographic projection of the first insulating layer on the base substrate is not overlapped with an orthographic projection of a portion for emitting light of the at least one light emitting element on the base substrate.

In some exemplary implementations, a material of the first electrode of the light emitting element includes a transparent conductive material, and a material of the second electrode includes a metal material.

In some exemplary implementations, the peripheral region includes: a bonding region located on a side of the display region, the bonding region includes: at least one first ground pin, at least one first signal pin and at least one second signal pin; the first ground pin is electrically connected to the ground trace, the first signal pin is electrically connected to the first signal trace, and the second signal pin is electrically connected to the second signal trace; and the first ground pin is located between the first signal pin and the second signal pin.

In some exemplary implementations, an orthographic projection of the portion for emitting light of the light emitting element on the base substrate is triangular.

In another aspect, an embodiment of the present disclosure provides a light emitting apparatus, including the light emitting substrate described above.

In a further aspect, an embodiment of the present disclosure provides a method for preparing a light emitting substrate, which is used for preparing the light emitting substrate described above. The preparation method includes: forming at least one anti-static trace in a display region of a base substrate, and forming a ground trace in a peripheral region on at least one side of the display region; and forming at least one light emitting element in the display region, wherein the ground trace is electrically connected to the at least one anti-static trace, and the at least one anti-static trace is configured to surround the at least one light emitting element.

Other aspects will become apparent upon reading and understanding the accompanying drawings and the detailed description.

BRIEF DESCRIPTION OF DRAWINGS

Accompanying drawings are used to provide an understanding of technical solutions of the present disclosure, form a part of the specification, and are used to explain the technical solutions of the present disclosure together with the embodiments of the present disclosure but are not intended to form limitations on the technical solutions of the present disclosure. Shapes and sizes of one or more components in the drawings do not reflect true scales, but are only intended to schematically describe contents of the present disclosure.

DETAILED DESCRIPTION

Figure 1:
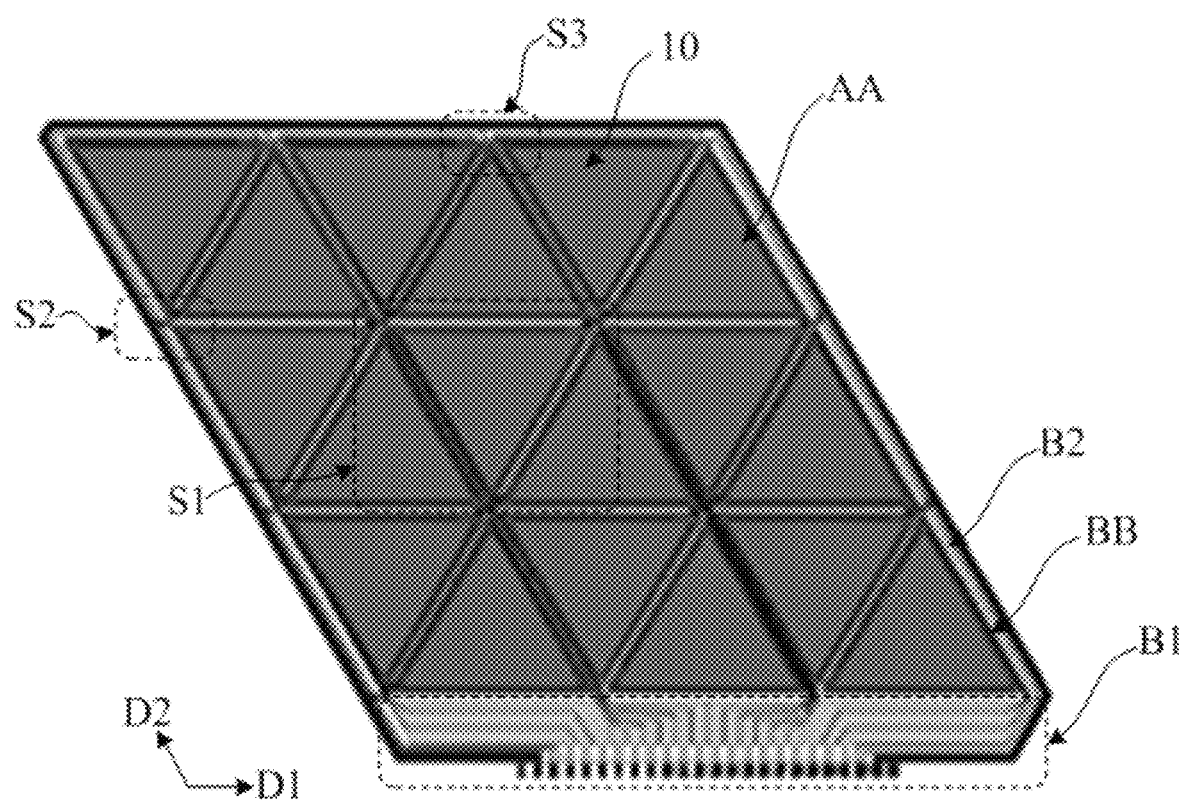
FIG. 1 is a schematic view of a light emitting substrate according to at least one embodiment of the present disclosure.

The embodiments of the present disclosure will be described below in detail in combination with the drawings. Implementations may be carried out in a plurality of different forms. Those of ordinary skills in the art may easily understand such a fact that implementation modes and contents may be transformed into one or more forms without departing from the purpose and scope of the present disclosure. Therefore, the present disclosure should not be explained as being limited to contents described in following implementation modes only. The embodiments in the present disclosure and features in the embodiments may be combined randomly with each other without conflict.

In the drawings, a size of one or more constituent elements, a thickness of a layer, or a region is sometimes exaggerated for clarity. Therefore, a mode of the present disclosure is not necessarily limited to the size, and a shape and a size of one or more components in the drawings do not reflect a true proportion. In addition, the drawings schematically illustrate ideal examples, and one implementation of the present disclosure is not limited to the shapes, numerical values, or the like shown in the drawings.

Ordinal numerals such as "first", "second" and "third" in the present disclosure are set to avoid confusion of constituent elements, but not intended for restriction in quantity. In the present disclosure, "a plurality of" represents two or more than two.

In the present disclosure, for convenience, wordings "central", "up", "down", "front", "back", "vertical", "horizontal", "top", "bottom", "inside", "outside" and the like indicating orientation or positional relationships are used to illustrate positional relationships between constituent elements with reference to the drawings, which are only to facilitate describing the present specification and simplify the description, rather than indicating or implying that involved devices or elements must have specific orientations and be structured and operated in the specific orientations, and thus should not be understood as limitations on the present disclosure. The positional relationships between the constituent elements are changed as appropriate based on directions for describing the constituent elements. Therefore, appropriate replacements may be made according to situations without being limited to the wordings described in the specification.

In the present disclosure, unless otherwise specified and defined, terms "mounting", "mutual connection" and "connection" should be understood in a broad sense. For example, it may be a fixed connection, a detachable connection, or an integral connection; it may be a mechanical connection or an electrical connection; it may be a direct mutual connection, or an indirect connection through middleware, or an internal communication between two components. Those of ordinary skills in the art may understand meanings of the above-mentioned terms in the present disclosure according to situations. An "electrical connection" includes a case where constituent elements are connected together through an element with a certain electrical action. "An element with a certain electrical action" is not particularly limited as long as electrical signals may be transmitted between the connected constituent elements. Examples of "an element with a certain electrical action" not only include electrodes and wirings, but also include switching elements such as transistors, resistors, inductors, capacitors, other elements with one or more functions, etc.

In the present disclosure, "parallel" refers to a state in which an angle formed by two straight lines is −10° or more and 10° or less, and thus may include a state in which the angle is −5° or more and 5° or less. In addition, "perpendicular" refers to a state in which an angle formed by two straight lines is 80° or more and 100° or less, and thus may include a state in which the angle is 85° or more and 95° or less.

In the present disclosure, "film" and "layer" are interchangeable. For example, a "conductive layer" may be replaced with a "conductive film" sometimes. Similarly, an "insulating film" may be replaced with an "insulating layer" sometimes.

Triangle, rectangle, trapezoid, pentagon, hexagon or the like in this specification is not strictly defined, and may be an approximate triangle, rectangle, trapezoid, pentagon, hexagon, or the like. There may be some small deformations caused by tolerance, and there may be chamfers, arc edges and deformations, etc.

In the present disclosure, "about" and "substantially" refer to a case that a boundary is not defined strictly and numerical values within process and measurement error ranges are allowed.

In the process of production, manufacture, inspection and use of a display, there are usually some external factors that cause an accumulation of electrostatic charges on the display. Electro-Static discharge (ESD) will occur when electrostatic charges are accumulated to a certain amount. ESD will produce an extremely high current, which will easily break down the components in a circuit or destroy a signal conductive line, resulting in signal abnormalities or even interruptions.

With the development of OLED display technology, vehicle-mounted OLED products have come into sights of consumers, but automotive-grade products are more stringent than consumer-grade products in many aspects. For example, an automotive-grade product needs to meet, under working conditions, electrostatic charge discharge protection of contact static electricity ±8 kV and air ±8/10/12/15 kV, it needs to meet the A-level requirement that there is no abnormality throughout the whole process after the occurrence of electrostatic discharge, as well as the B-level requirement that bright line flash may occur when the electrostatic discharge occurs but a normal state is resumed automatically within a specified number of seconds. The consumer-grade products only need to meet the C-level requirement that a normal display can be resumed upon restarting after an abnormal electrostatic discharge.

Embodiments of the present disclosure provide a light emitting substrate and a preparation method therefor, and a light emitting apparatus, which may enhance the anti-static capability and improve the breakdown resistance of the light emitting substrate under high-strength ESD conditions.

The light emitting substrate according to an embodiment of the present disclosure includes: a base substrate, at least one light emitting element, at least one anti-static trace, and a ground trace. The base substrate includes a display region and a peripheral region located on at least one side of the display region. The at least one light emitting element and the at least one anti-static trace are located in the display region. The at least one anti-static trace is configured to surround the at least one light emitting element. The ground trace is located in the peripheral region, and the ground trace is electrically connected with the at least one anti-static trace.

In some examples, each light emitting element of the light emitting substrate may be surrounded by an anti-static trace, or a plurality of light emitting elements may be surrounded by one anti-static trace. In some examples, an orthographic projection of the anti-static trace on the base substrate may surround an orthographic projection of a portion for emitting light of at least one light emitting element on the base substrate.

For the light emitting substrate according to the embodiment, the anti-static capability may be enhanced by arranging the anti-static trace to surround the light emitting element, thereby improving the breakdown resistance of the light emitting substrate under high-strength ESD conditions.

In some exemplary implementations, at least one anti-static trace may form a mesh structure, the mesh structure may include at least one mesh, and the at least one mesh may surround at least one light emitting element. In some examples, one anti-static trace may have one mesh, and a plurality of anti-static traces may be connected to form a plurality of meshes. Each mesh may surround one light emitting element. However, the embodiment is not limited thereto. For example, each mesh may include two or more light emitting elements.

In some exemplary implementations, adjacent anti-static traces in the display region may constitute an integrated structure, or may be electrically connected through a first connection electrode. In some examples, the anti-static trace may include: a first extension portion and a first connection portion connected to each other. An orthographic projection of the first extension portion on the base substrate may be annular. The first connection portion of the anti-static trace and a first connection portion of another anti-static trace may constitute an integrated structure, or the first connection portion of the anti-static trace may be electrically connected with a first connection portion of another anti-static trace through the first connection electrode. In some examples, the first extension portion of the anti-static trace may form at least one mesh, and electrical connection between meshes is achieved by the first connection portion. However, the embodiment is not limited thereto.

In some exemplary implementations, the first connection electrode may be located on a side of the anti-static trace away from the base substrate. In some examples, the first connection electrode and a first electrode of the light emitting element may be of a same layer structure. However, the embodiment is not limited thereto.

In some exemplary implementations, the ground trace may be electrically connected to the at least one anti-static trace through a second connection electrode. In some examples, the ground trace and the anti-static trace may be of a same layer structure, and the second connection electrode may be located on a side of the ground trace away from the base substrate. For example, the second connection electrode and the first electrode of the light emitting element may be of a same layer structure.

In some exemplary implementations, the display region may further be provided with a pixel definition layer. The pixel definition layer may have at least one pixel opening, and a portion of the light emitting element located at the pixel opening may be used for emitting light. An orthographic projection of the pixel definition layer on the base substrate may cover an orthographic projection of the anti-static trace on the base substrate. In this example, the portion for emitting light of the light emitting element may be a region corresponding to the pixel opening of the pixel definition layer.

In some exemplary implementations, the light emitting element may include: a first electrode, a second electrode, and an organic light emitting layer arranged between the first electrode and the second electrode. The first electrode may be located on a side of the organic light emitting layer close to the base substrate, the pixel opening of the pixel definition layer may expose at least a portion of the first electrode, the organic light emitting layer may be in contact with the first electrode through the pixel opening, the second electrode may be located on a side of the organic light emitting layer away from the base substrate, and the second electrode may be in contact with the organic light emitting layer. In some examples, the light emitting element may be an organic light emitting element (OLED).

In some exemplary implementations, the light emitting substrate may further include: at least one first signal trace and at least one second signal trace. The first signal trace extends from the peripheral region to the display region and is electrically connected to the first electrode of at least one light emitting element. The second signal trace is located in the peripheral region and is electrically connected to the second electrode of the at least one light emitting element. In some examples, the light emitting substrate only needs to realize illumination display without complicated pixel circuit control, and a drive voltage may be provided to the first electrode and the second electrode of the light emitting element through the signal traces, thereby driving the light emitting element to emit light.

In some exemplary implementations, in the display region, the anti-static trace may be located between the first signal trace and the light emitting element. In some examples, the anti-static trace may surround the light emitting element in the display region, and the first signal trace may be located on a side of the anti-static trace away from the light emitting element, thereby enhancing the anti-static capability of the light emitting element.

In some exemplary implementations, in the peripheral region, the ground trace may be located between the second signal trace and the first signal trace. In this example, the ground trace is arranged between the first signal trace and the second signal trace, so that heat of the first signal trace and the second signal trace may be released properly, thereby ensuring the service life of the light emitting element.

In some exemplary implementations, the light emitting substrate may further include: a first conductive layer located on a side of at least one light emitting element close to the base substrate. The first signal trace, the second signal trace, the anti-static trace and the ground trace may all be located in the first conductive layer. In this example, the first signal trace, the second signal trace, the anti-static trace and the ground trace are arranged in a same layer, which may simplify the preparation process of the light emitting substrate. However, the embodiment is not limited thereto. For example, the anti-static trace may be located between the first conductive layer and the light emitting element.

In some exemplary implementations, the light emitting substrate may further include: a first insulating layer located between the light emitting element and the first conductive layer. An orthographic projection of the first insulating layer on the base substrate may be not overlapped with an orthographic projection of a portion for emitting light of at least one light emitting element on the base substrate. In some examples, the light emitting substrate may be a bottom emission structure, i.e., light may be emitted from the side of the base substrate. By removing a portion of the first insulating layer on a side of the light emitting element close to the base substrate, the influence of shielding of the first insulating layer on light may be avoided, thereby ensuring the light emitting effect of the light emitting substrate.

In some exemplary implementations, the peripheral region may include: a bonding region located on a side of the display region. The bonding region may include: at least one first ground pin, at least one first signal pin, and at least one second signal pin. The first ground pin may be electrically connected to the ground trace, the first signal pin may be electrically connected to the first signal trace, and the second signal pin may be electrically connected to the second signal trace. The first ground pin may be located between the first signal pin and the second signal pin. In this example, grounding performance may be ensured, and electrostatic protection may be improved.

The structure of the embodiment will be described below through some examples.

FIG. 1 is a schematic view of a light emitting substrate according to at least one embodiment of the present disclosure. In some exemplary implementations, as shown in FIG. 1, the light emitting substrate may include: a display region AA and a peripheral region BB located on a periphery of the display region AA. The peripheral region BB may include a bonding region B1 located on a side of the display region AA and a bezel region B2 located on other sides of the display region AA. For example, the peripheral region BB may be located around the display region AA, the bonding region B1 may be located on a lower side of the display region AA, and the bezel region B2 may include regions on a left side, an upper side and a right side of the display region AA. However, the embodiment is not limited thereto. For example, the peripheral region BB may be located on at least one side of the display region AA, and the bonding region B1 may be located on the upper side, the left side or the right side of the display region AA.

In some examples, as shown in FIG. 1, the display region AA of the light emitting substrate may be in a shape of a quadrilateral, for example, a parallelogram. However, the embodiment is not limited thereto. For example, the display region AA of the light emitting substrate may be in other shapes, such as a circle, an ellipse, a rectangle, a pentagon or a hexagon.

In some examples, as shown in FIG. 1, the display region AA may be provided with a plurality of light emitting elements 10. The plurality of light emitting elements 10 may be regularly arranged in the display region AA. For example, the plurality of light emitting elements 10 may be arranged in a plurality of columns in a first direction D1 and in a plurality of rows in a second direction D2, in the display region AA. A plurality of light emitting elements 10 arranged in the first direction D1 may be referred to as a row of light emitting elements, and a plurality of light emitting elements 10 arranged in the second direction D2 may be referred to as a column of light emitting elements. The light emitting substrate shown in FIG. 1 may include six rows and six columns of light emitting elements 10, with three light emitting elements 10 in each row and three light emitting elements 10 in each column, and eighteen light emitting elements 10 may be included altogether. However, the number of light emitting elements 10 included in the light emitting substrate is not limited in the embodiment. In some examples, the first direction D1 may intersect with the second direction D2. For example, an angle between the first direction D1 and the second direction D2 in the counter-clockwise direction may be about 108 degrees to 132 degrees, for example, may be about 120 degrees. However, the embodiment is not limited thereto. For example, the light emitting substrate may be rectangular, then the first direction and the second direction may be perpendicular to each other.

In some examples, as shown in FIG. 1, the shape of the light emitting element 10 may be a triangle, e.g., an equilateral triangle. For example, a length of side of the light emitting element 10 may be about 9 mm to 11 mm, for example, may be about 10 mm. However, the embodiment is not limited thereto. In some other examples, the shape of the light emitting element 10 may be a rectangle, a rhombus, a pentagon, a hexagon or the like.

In some examples, as shown in FIG. 1, the color of light emitted by the light emitting element 10 may be determined as needed. For example, the light emitting element 10 may emit red light, green light, blue light, white light or the like. In some examples, the light emitting element 10 may be an organic light emitting diode (OLED). The light emitting element 10 may include: a first electrode, a second electrode, and an organic light emitting layer located between the first electrode and the second electrode. Under driving of voltages of the first electrode and the second electrode, light may be emitted according to a required gray scale by utilizing light emitting characteristics of an organic material of the organic light emitting layer. For example, the first electrode may be an anode, and the second electrode may be a cathode. However, the embodiment is not limited thereto. In an embodiment of the present disclosure, the portion for emitting light of the light emitting element may refer to an overlapping portion of the first electrode, the organic light emitting layer and the second electrode of the light emitting element.

In some examples, as shown in FIG. 1, the light emitting element 10 may be an independent light emitting element. However, the embodiment is not limited thereto. In some other examples, the light emitting element 10 may include a plurality of sub-light emitting elements arranged regularly. The plurality of sub-light emitting elements may be substantially the same in shape and size. First electrodes of the plurality of sub-light emitting elements may be connected in parallel, thereby realizing synchronous light emitting. For example, the shape of the sub-light emitting element may be a triangle, e.g., an equilateral triangle, and a length of side of the sub-light emitting element may be about 270 microns (um) to 330 um, e.g., may be about 300 um.

Figure 2:
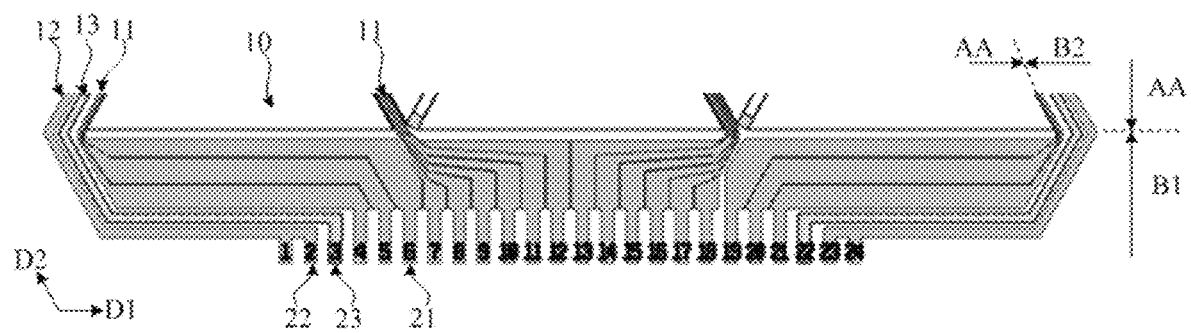
FIG. 2 is a schematic view of a bonding region of a light emitting substrate according to at least one embodiment of the present disclosure.

FIG. 2 is a schematic view of a bonding region of a light emitting substrate according to at least one embodiment of the present disclosure. In some exemplary implementations, as shown in FIG. 1 and FIG. 2, the bonding region B1 may be provided with a plurality of bonding pins. The plurality of bonding pins may include: at least one (e.g., two) first ground pin 23, a plurality of (e.g., eighteen) first signal pins 21, and a plurality of (e.g., four) second signal pins 22. For example, two second signal pins 22, one first ground pin 23, eighteen first signal pins 21, one first ground pin 23, and two second signal pins 22 may be sequentially arranged in the first direction D1. The first ground pin 23 may be located between the second signal pin 22 and the first signal pin 21. The number of bonding pins is not limited in the embodiment.

In some examples, as shown in FIG. 2, the first ground pin 23 may be electrically connected to the ground trace 13, for example, the first ground pin 23 and the ground trace 13 may constitute an integrated structure. After being electrically connected to the first ground pin 23 in the bonding region B1, the ground trace 13 may extend from the bonding region B1 to the bezel region B2. The ground trace 13 may be arranged around the display region AA in the bezel region B2.

In some examples, as shown in FIG. 2, the second signal pin 22 may be electrically connected to the second signal trace 12. For example, the plurality of second signal pins 22 and the second signal trace 12 may constitute an integrated structure. The second signal trace 12 may extend from the bonding region B1 to the bezel region B2. The second signal trace 12 may be arranged around the display region AA in the bezel region B2, and in the bezel region B2, the second signal trace 12 may be located on a side of the ground trace 13 away from the display region AA.

In some examples, as shown in FIG. 2, the first signal pin 21 may be electrically connected to the first signal trace 11. The plurality of first signal pins 21 and the plurality of first signal traces 11 may be electrically connected in one-to-one correspondence. For example, one first signal pin 21 and one first signal trace 11 may constitute an integrated structure. At least one first signal trace 11 may extend from the bonding region B1 to the bezel region B2, and at least one first signal trace 11 may extend from the bonding region B1 to the display region AA and may be arranged in a gap between adjacent light emitting elements 10. In some examples, the plurality of first signal traces 11 may be electrically connected to the plurality of light emitting elements 10 in one-to-one correspondence. One first signal trace 11 may be configured to provide a drive signal to one light emitting element 10. However, the embodiment is not limited thereto. For example, one first signal trace 11 may be electrically connected to a plurality of light emitting elements 10 and configured to provide a drive signal to the plurality of light emitting elements 10.

In this example, as shown in FIG. 2, the ground trace 13 is located between the first signal trace 11 and the second signal trace 12 in the bezel region B2, and the first ground pin 23 is located between the first signal pin 21 and the second signal pin 22 in the bonding region B1. In this way, good grounding performance may be ensured, ESD protection may be enhanced, and heat of the first signal trace 11 and the second signal trace 12 may be properly released to guarantee the service life of the light emitting substrate.

Figure 3:
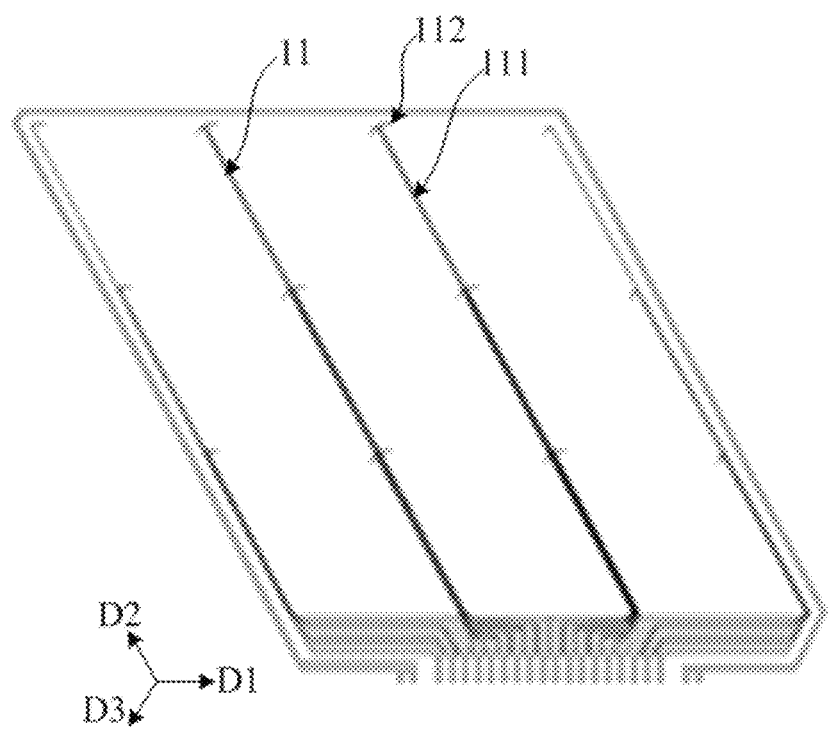
FIG. 3 is a schematic view of the layout of a first signal trace according to at least one embodiment of the present disclosure.

FIG. 3 is a schematic view of the layout of a first signal trace according to at least one embodiment of the present disclosure. In some examples, as shown in FIG. 1 and FIG. 3, a plurality of first signal traces 11 may be arranged between the second and third columns of light emitting elements 10 and between the fourth and fifth columns of light emitting elements 10 in the display region AA, and the first signal traces 11 may also be arranged in the bezel region B2 on the left and right sides of the display region AA. One first signal trace 11 may include a second extension portion 111 and a second connection portion 112. The second extension portion 111 may extend in the second direction D2. The second connection portion 112 of the first signal trace 11 may extend in the first direction D1 or may extend in a third direction D3. The third direction D3 intersects with both the first direction D1 and the second direction D2. For example, an angle between the first direction D1 and the third direction D3 in the clockwise direction may be about 108 degrees to 132 degrees, for example, may be about 120 degrees. The second extension portion 111 and the second connection portion 112 of one first signal trace 11 may constitute an integrated structure. The second connection portion 112 of the first signal trace 11 may be electrically connected to a corresponding light emitting element 10.

Figure 4:
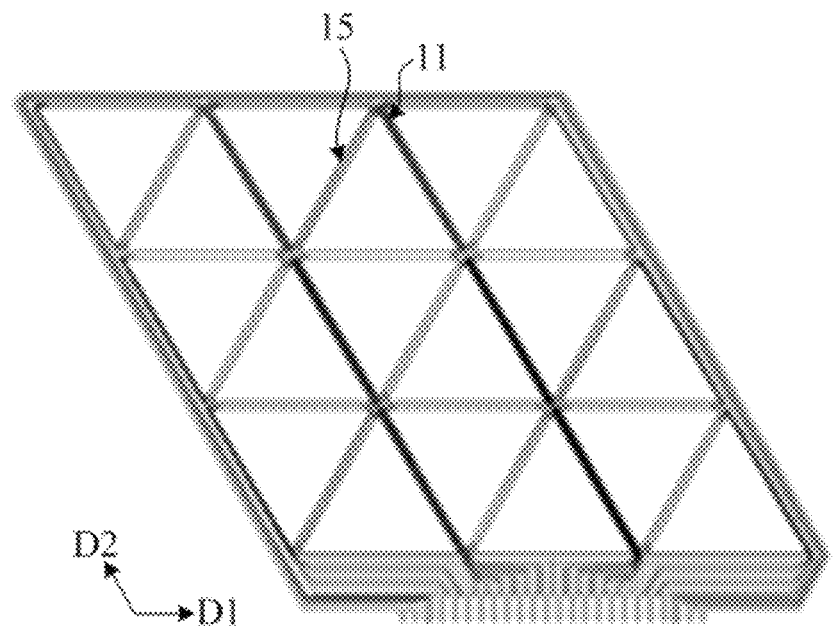
FIG. 4 is a schematic view of the layout of an anti-static trace according to at least one embodiment of the present disclosure.

FIG. 4 is a schematic view of the layout of an anti-static trace according to at least one embodiment of the present disclosure. In some examples, as shown in FIG. 1 and FIG. 4, the display region AA may be provided with a plurality of anti-static traces 15. The anti-static traces 15 may be located on a side of the first signal trace 11 close to the light emitting element 10. For example, adjacent anti-static traces 15 arranged in the second direction D2 may constitute an integrated structure. In the first direction D1, anti-static traces 15 located on two sides of the first signal trace 11 may be electrically connected through the first connection electrode to cross the first signal trace 11. The plurality of anti-static traces 15 may be connected to form a mesh structure in the display region AA, the mesh structure may include a plurality of meshes, and each of the meshes may surround a light emitting element 10. However, the embodiment is not limited thereto. In some other examples, one mesh of the mesh structure may surround a plurality of light emitting elements.

Figure 5A:
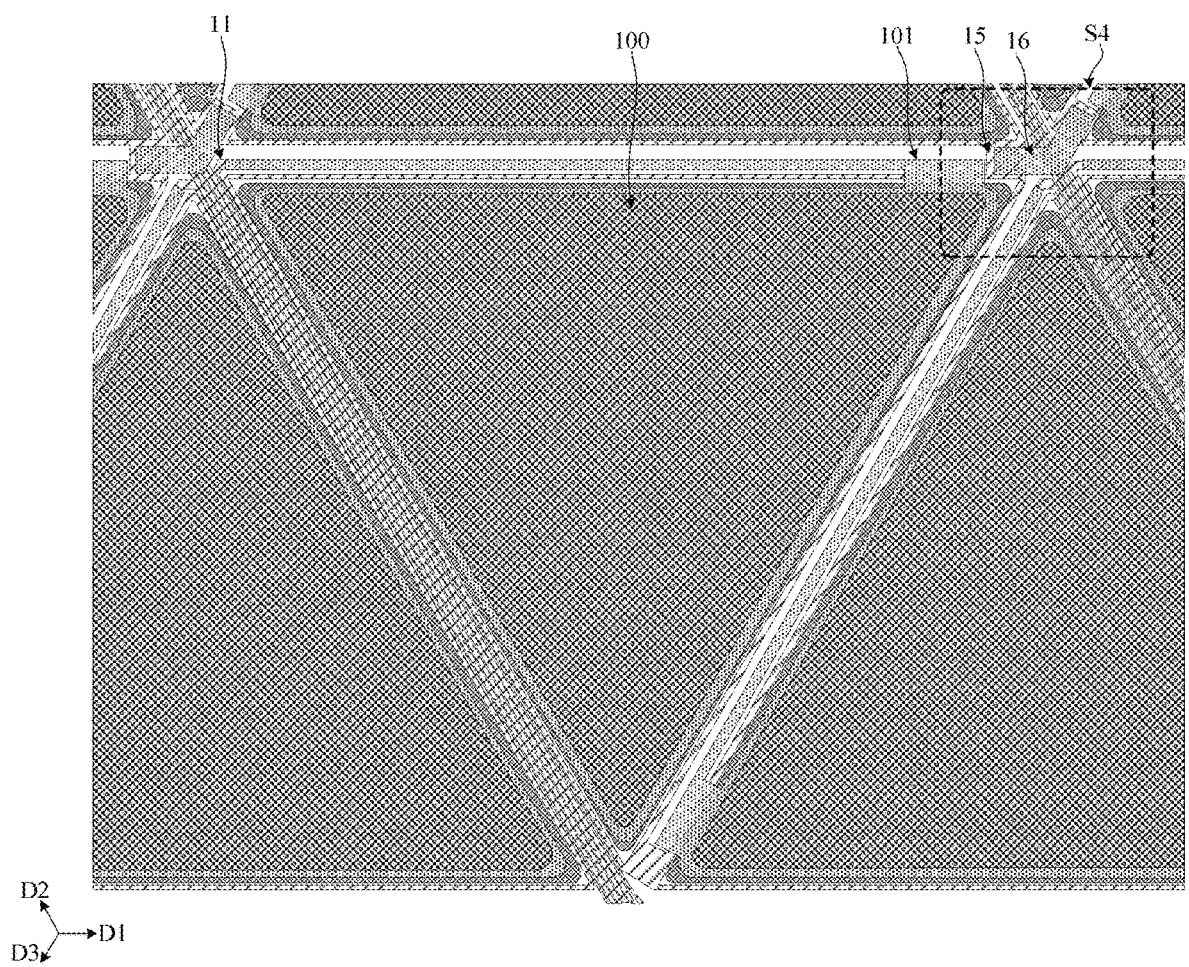
FIG. 5A is a schematic partially enlarged view of a region S1 in FIG. 1.
Figure 5B:
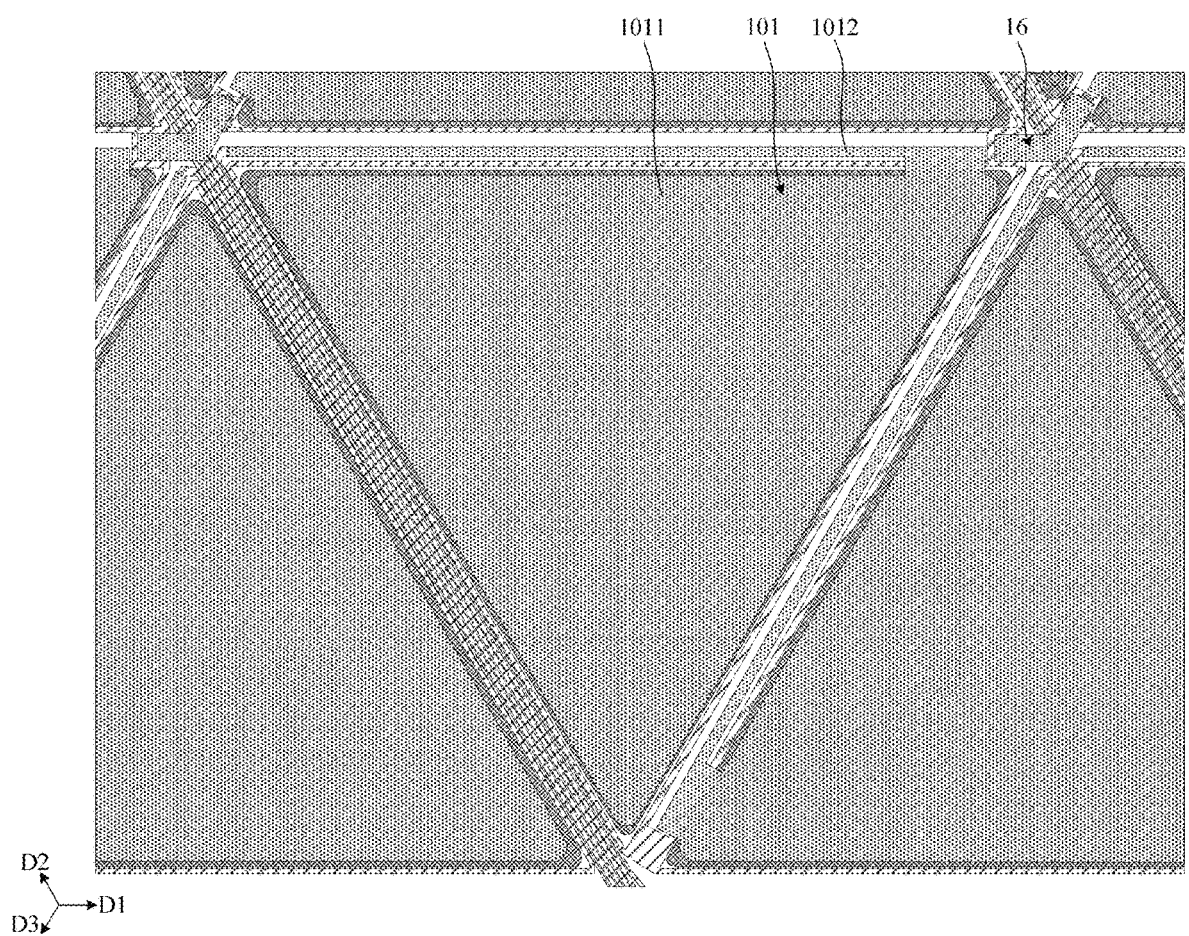
FIG. 5B is a schematic view of a light emitting substrate after formation of a second conductive layer in FIG. 5A.
Figure 5C:
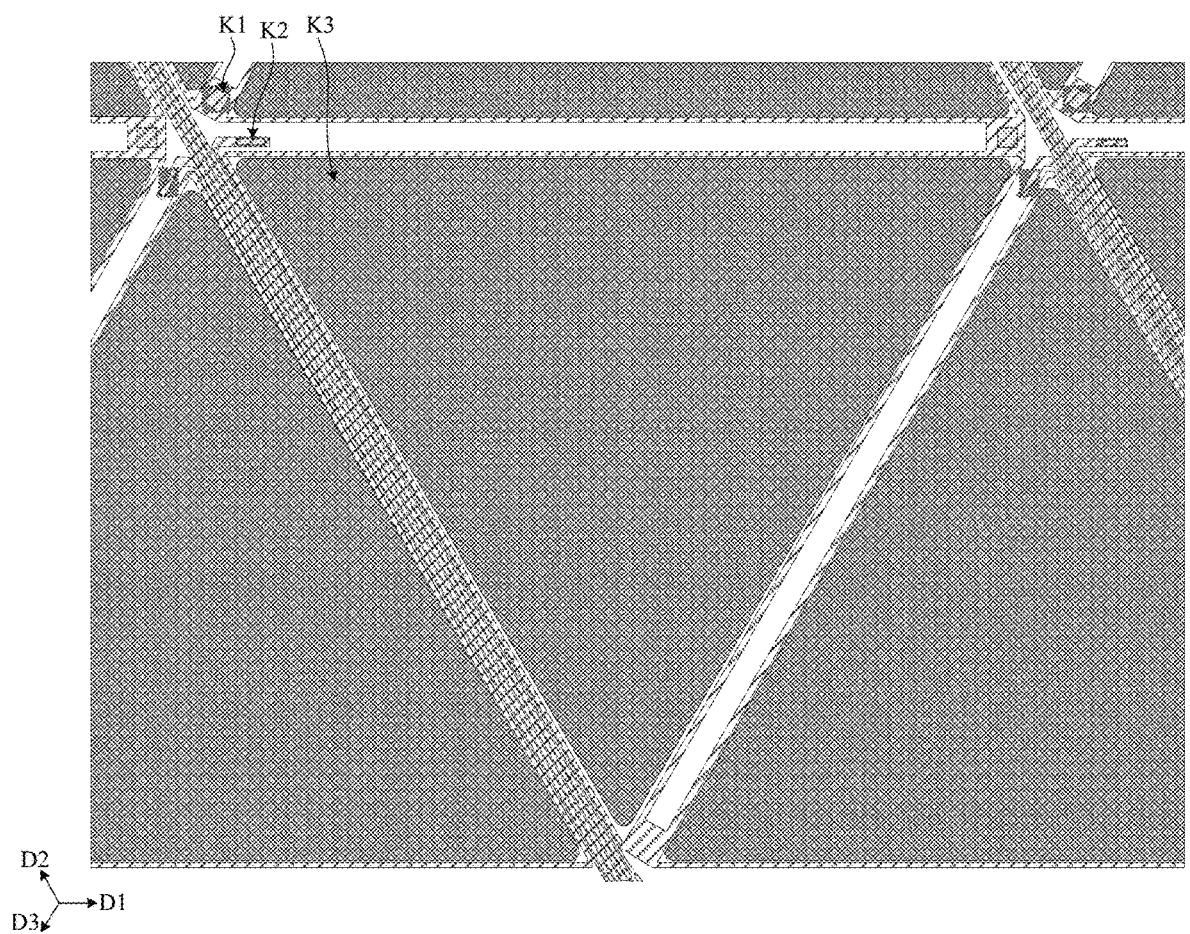
FIG. 5C is a schematic view of a light emitting substrate after formation of a first insulating layer in FIG. 5A.
Figure 5D:
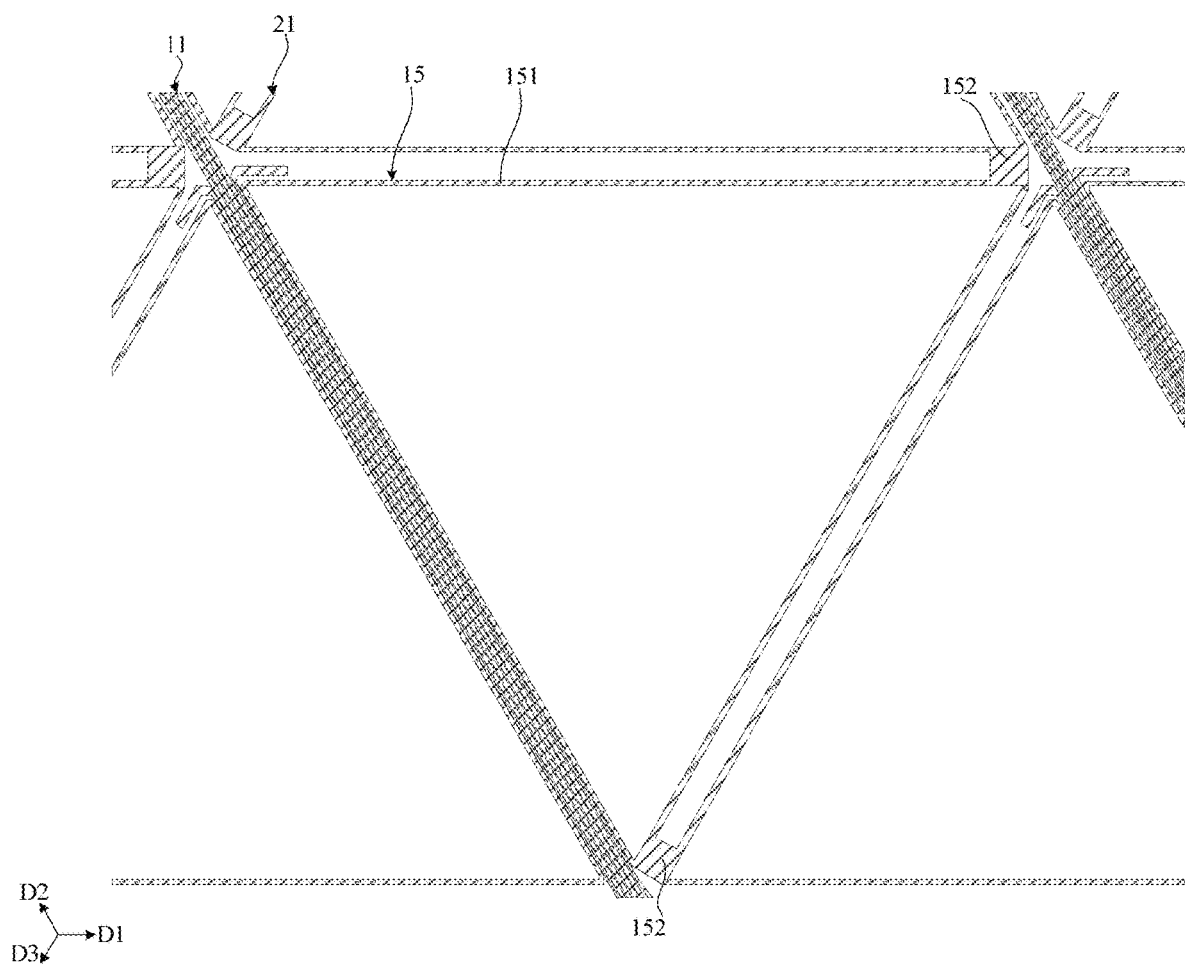
FIG. 5D is a schematic view of a light emitting substrate after formation of a first conductive layer in FIG. 5A.
Figure 6A:
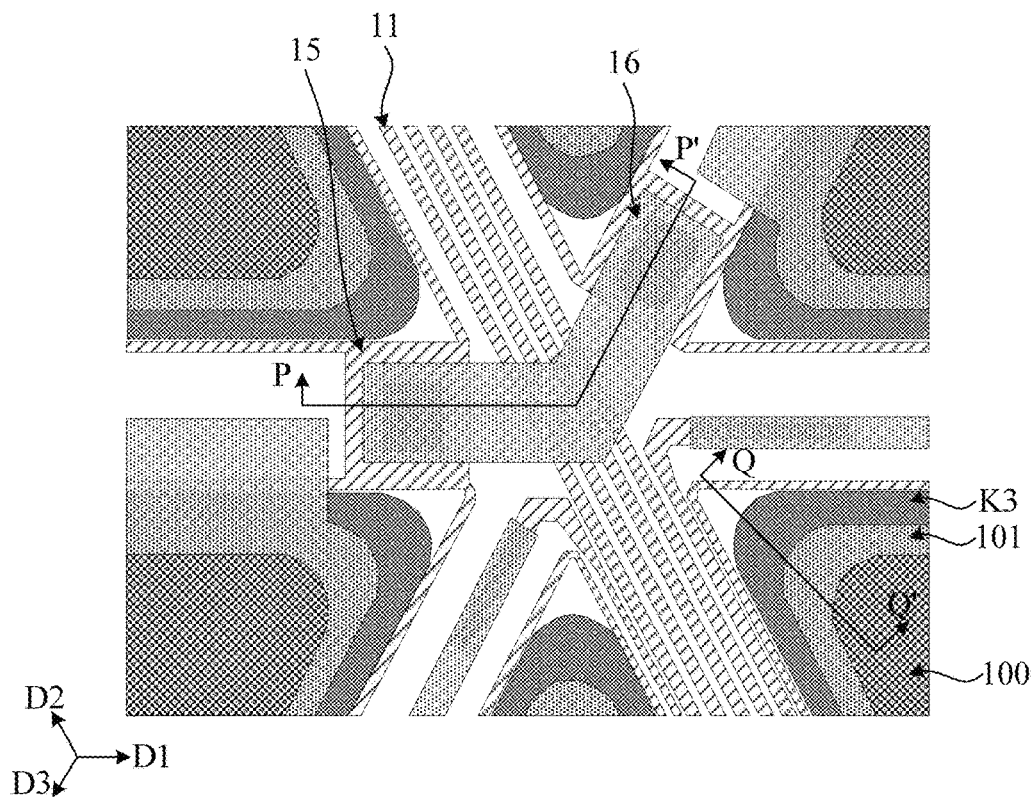
FIG. 6A is a schematic partially enlarged view of a region S4 in FIG. 5A.
Figure 6B:
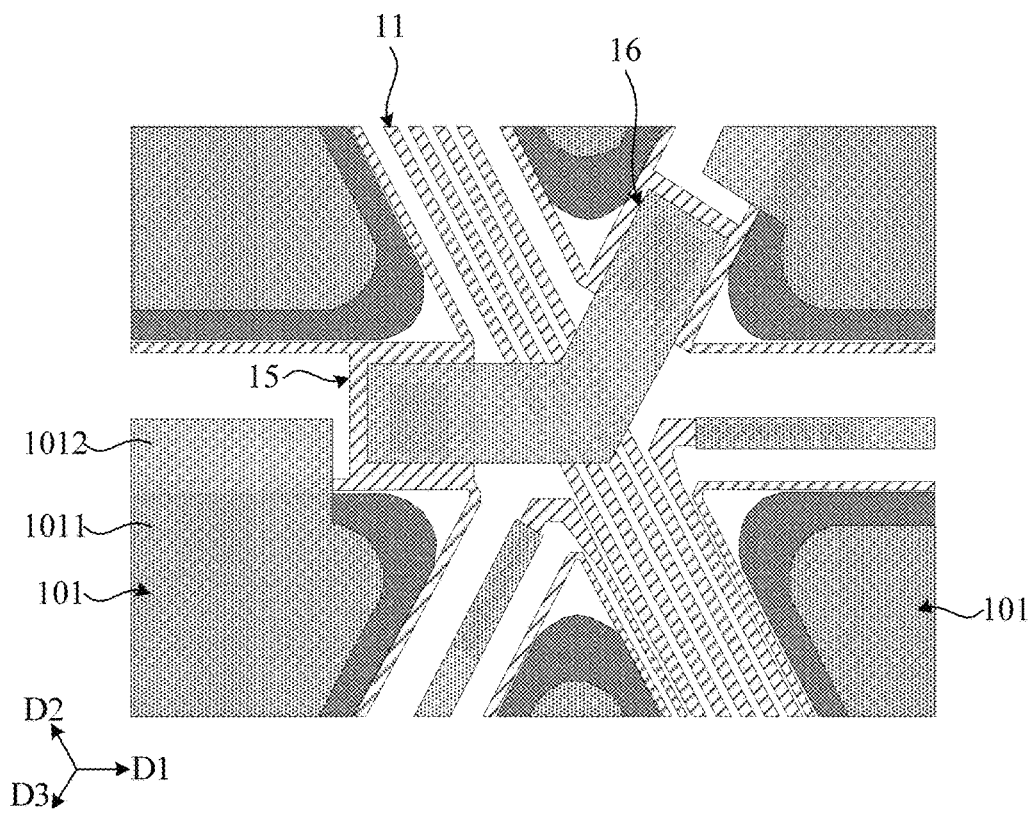
FIG. 6B is a schematic view of a light emitting substrate after formation of a second conductive layer in FIG. 6A.
Figure 6C:
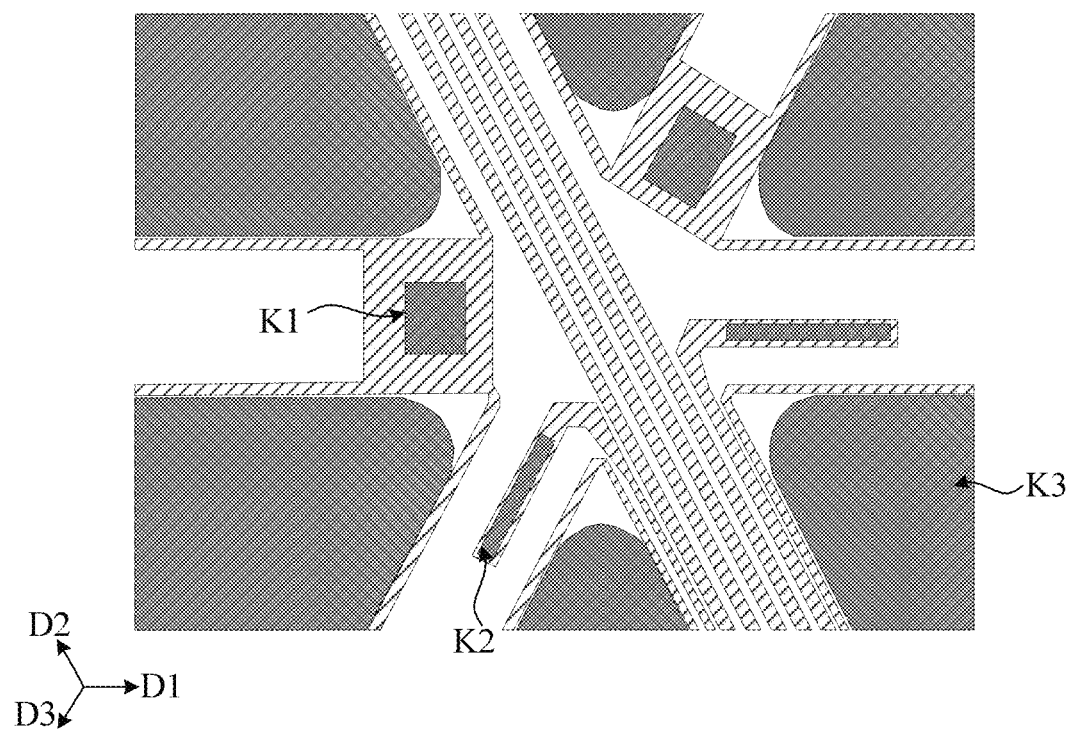
FIG. 6C is a schematic view of a light emitting substrate after formation of a first insulating layer in FIG. 6A.
Figure 6D:
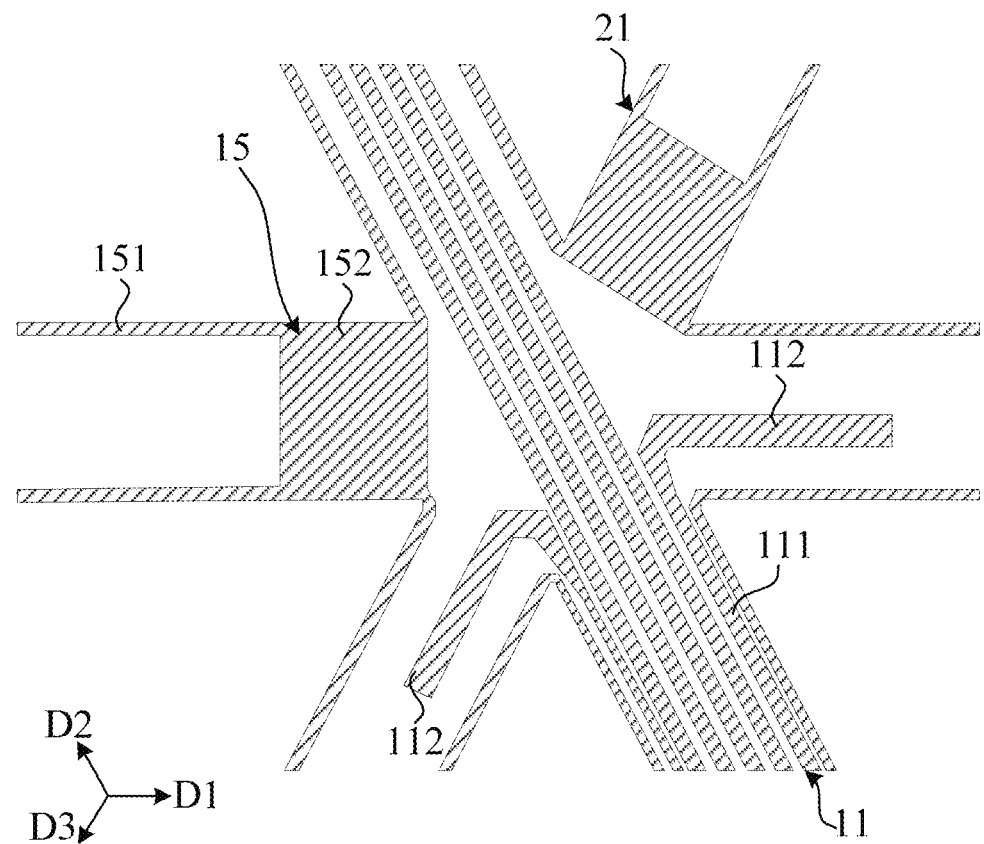
FIG. 6D is a schematic view of a light emitting substrate after formation of a first conductive layer in FIG. 6A.
Figure 7:
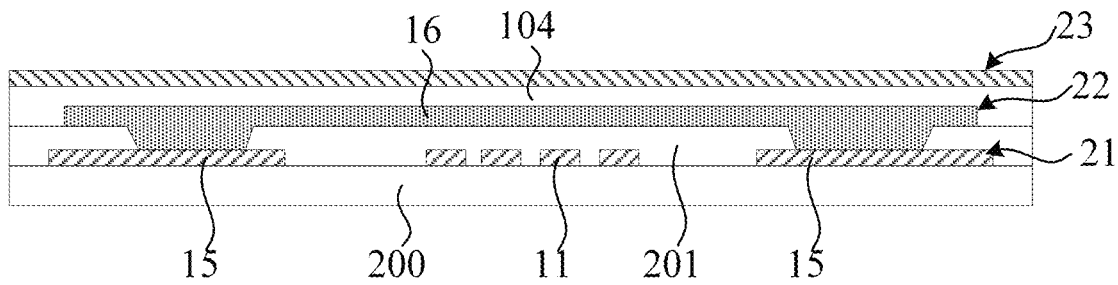
FIG. 7 is a schematic view of a partial section in a P-P' direction in FIG. 6A.
Figure 8:
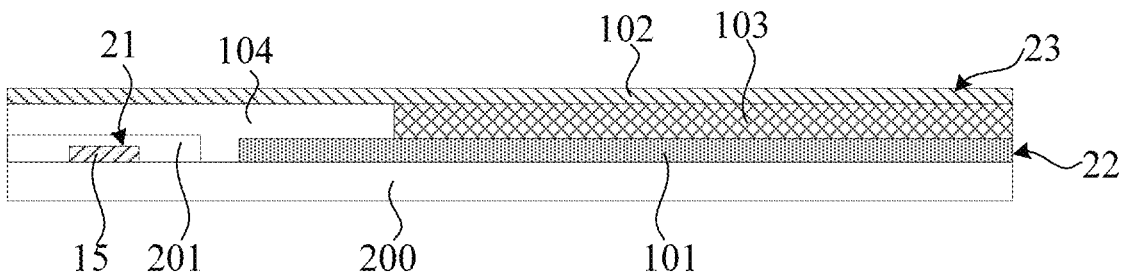
FIG. 8 is a schematic view of a partial section in a Q-Q' direction in FIG. 6A.

FIG. 5A is a schematic partially enlarged view of a region S1 in FIG. 1. FIG. 5B is a schematic view of a light emitting substrate after formation of a second conductive layer in FIG. 5A. FIG. 5C is a schematic view of a light emitting substrate after formation of a first insulating layer in FIG. 5A. FIG. 5D is a schematic view of a light emitting substrate after formation of a first conductive layer in FIG. 5A. FIG. 6A is a schematic partially enlarged view of a region S4 in FIG. 5A. FIG. 6B is a schematic view of a light emitting substrate after formation of a second conductive layer in FIG. 6A. FIG. 6C is a schematic view of a light emitting substrate after formation of a first insulating layer in FIG. 6A. FIG. 6D is a schematic view of a light emitting substrate after formation of a first conductive layer in FIG. 6A. FIG. 7 is a schematic view of a partial section in a P-P' direction in FIG. 6A. FIG. 8 is a schematic view of a partial section in a Q-Q' direction in FIG. 6A.

In some exemplary implementations, as shown in FIG. 7 and FIG. 8, in a direction perpendicular to the light emitting substrate, the light emitting substrate in the display region AA may include: a base substrate 200, and a first conductive layer 21, a first insulating layer 201 and a light emitting structure layer arranged on the base substrate 200. The light emitting structure layer may include: a second conductive layer 22, a pixel definition layer 104, an organic light emitting layer 103 and a third conductive layer 23 that are sequentially arranged on the base substrate 200. The first insulating layer 201 may be an inorganic insulating layer. However, the embodiment is not limited thereto.

In some exemplary implementations, as shown in FIG. 5D and FIG. 6D, the first conductive layer 21 in the display region AA may include: a plurality of first signal traces 11 and a plurality of anti-static traces 15. The first signal trace 11 may include a second connection portion 112 and a second extension portion 111 extending in the second direction D2. The second connection portions 112 of some of the first signal traces 11 may extend in the first direction D1, and the second connection portions 112 of some of the first signal traces 11 may extend in the third direction D3. The second extension portion 111 and the second connection portion 112 of the first signal trace 11 may constitute an integrated structure. The second extension portion 111 of the first signal trace 11 may be located between adjacent columns of light emitting elements, and the second connection portion 112 may be located between adjacent rows of light emitting elements. As shown in FIG. 6D, six first signal traces 11 may be arranged between adjacent columns of light emitting elements. However, the embodiment is not limited thereto.

In some exemplary implementations, as shown in FIG. 5D and FIG. 6D, one anti-static trace 15 may include: a first extension portion 151 and at least one first connection portion 152. The first extension portion 151 may be annular, for example, triangularly annular. The first connection portion 152 of the anti-static trace 15 is electrically connected to the first extension portion 151, for example, they may constitute an integrated structure. The first connection portion 152 may be electrically connected to the first extension portion 151 at a corner of the first extension portion 151. A plurality of anti-static traces 15 located between adjacent first signal traces 11 may be arranged sequentially in the second direction D2, and the first connection portions 152 of adjacent anti-static traces 15 arranged in the second direction D2 may constitute an integrated structure. As shown in FIG. 5D, one anti-static trace 15 may include a first extension portion 151 and two first connection portions 152, one first connection portion 152 may be located at a right corner of the first extension portion 151 and connected to a first connection portion of an adjacent anti-static trace in the second direction D2, and the other first connection portion 152 may be located at a lower corner of the first extension portion 151 and connected to a first connection portion of another anti-static trace in the second direction D2. The second connection portion 112 of the first signal trace 11 may be adjacent to the first connection portion 152 of the anti-static trace 15 in the second direction D2. The anti-static traces 15 located on two sides of the first signal trace 11 in the first direction D1 may be electrically connected through the first connection electrode 16.

In some exemplary implementations, as shown in FIG. 5C and FIG. 6C, the first insulating layer 201 in the display region AA may be provided with a plurality of vias and grooves, which, for example, may include: a first via K1, a second via K2, and a first groove K3. The first insulating layer 201 in the first via K1 is removed to expose a surface of the first connection portion 152 of the anti-static trace 15. The first insulating layer 201 in the second via K2 is removed to expose a surface of the second connection portion 112 of the first signal trace 11. An orthographic projection of the first groove K3 on the base substrate 200 may be located within an orthographic projection of a region surrounded by the first extension portion 151 of the anti-static trace 15 on the base substrate 200. The orthographic projection of the first groove K3 on the base substrate 200 may be not overlapped with the orthographic projection of the anti-static trace 15 on the base substrate 200. In this example, by removing the first insulating layer 201 under the position of the light emitting element, light transmittance of one side of the base substrate 200 may be improved, thereby preventing the first insulating layer 201 from affecting light emission of the light emitting substrate.

In some exemplary implementations, as shown in FIG. 5B and FIG. 6B, the second conductive layer 22 in the display region AA may include: first electrodes 101 of a plurality of light emitting elements, and a plurality of first connection electrodes 16. The first electrode 101 of the light emitting element may include: a first main body 1011 and a third connection portion 1012. The first main body 1011 and the third connection portion 1012 of the first electrode 101 may constitute an integrated structure. An orthographic projection of the first main body 1011 on the base substrate 200 may be a triangle, for example, a rounded triangle. The third connection portion 1012 may be strip-shaped, and one end of the third connection portion 1012 may be electrically connected to the first main body 1011, and the other end of the third connection portion 1012 may extend to be electrically connected to the second connection portion 112 of the first signal trace 11. The third connection portion 1012 may be electrically connected to the second connection portion 112 of the first signal trace 11 through the second via K2. The orthographic projection of the first extension portion 151 of the anti-static trace 15 on the base substrate 200 may be not overlapped with an orthographic projection of the first main body 1011 of the first electrode 101 on the base substrate 200, and the orthographic projection of the first main body 1011 of the first electrode 101 on the base substrate 200 may be located within the orthographic projection of the first groove K3 on the base substrate 200.

In some exemplary implementations, as shown in FIG. 5B and FIG. 6B, one end of the first connection electrode 16 may be electrically connected to a first connection portion 152 of one anti-static trace 15 through one first via K1, and the other end of the first connection electrode 16 may be electrically connected to a first connection portion 152 of another anti-static trace 15 through another first via KI to cross the first signal trace 11 between the two anti-static traces 15. For example, one end of the first connection electrode 16 may extend in the first direction D1 and the other end of the first connection electrode 16 may extend in the third direction D3. The orthographic projection of the first connection electrode 16 on the base substrate 200 may be V-shaped. However, the embodiment is not limited thereto.

In some exemplary implementations, as shown in FIG. 5A and FIG. 6A, the pixel definition layer 104 in the display region AA may have a plurality of pixel openings 100. The pixel definition layer 104 in a pixel opening 100 is removed to expose at least a portion of the first electrode 101 of the light emitting element. The orthographic projection of the first electrode 101 of the light emitting element on the base substrate 200 may include an orthographic projection of the pixel opening 100 on the base substrate 200. In some examples, the orthographic projection of the pixel opening 100 on the base substrate 200 may be a triangle, for example, a rounded triangle.

In some exemplary implementations, as shown in FIG. 7 and FIG. 8, the organic light emitting layer 103 of the light emitting element may be in contact with the first electrode 101 through the pixel opening 100. The third conductive layer 23 in the display region AA may include second electrodes 102 of a plurality of light emitting elements. The second electrode 102 of the light emitting element may be in contact with the organic light emitting layer 103. The second electrodes 102 of the plurality of light emitting elements may constitute an integrated structure. In this example, a portion of the light emitting element located at the pixel opening 100 is an overlapping portion of the first electrode 101, the organic light emitting layer 103 and the second electrode 102, which may be used for emitting light. One mesh formed by the first extension portion 151 of the anti-static trace 15 may surround a portion for emitting light of one light emitting element.

Figure 9A:
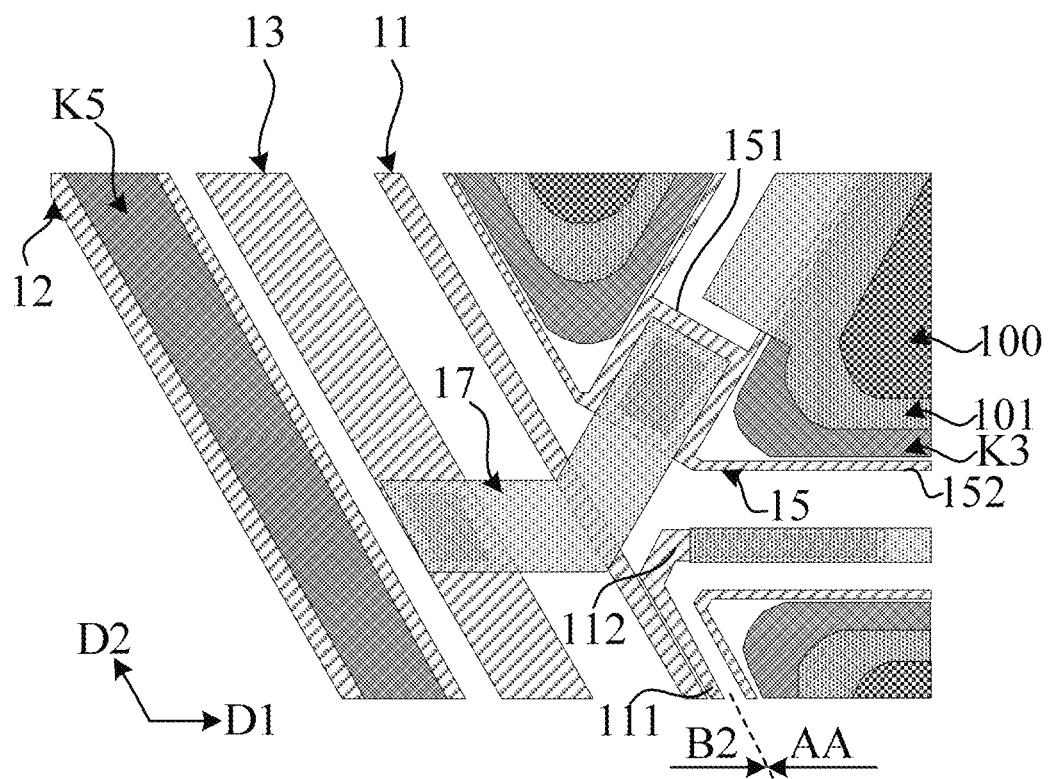
FIG. 9A is a schematic partially enlarged view of a region S2 in FIG. 1.
Figure 9B:
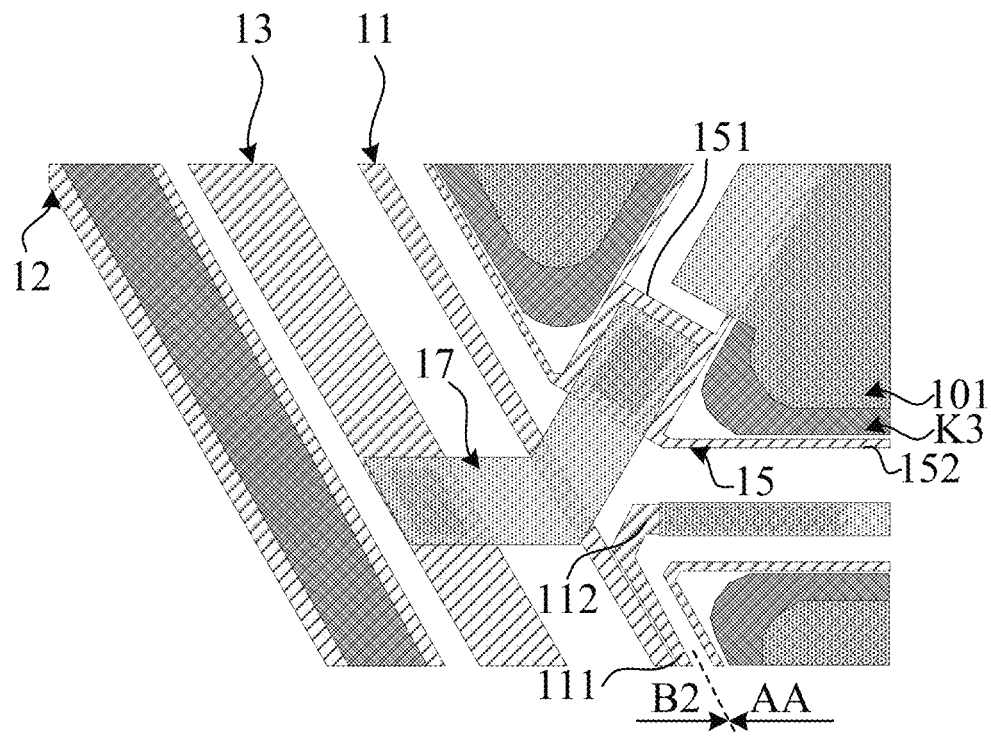
FIG. 9B is a schematic view of a light emitting substrate after formation of a second conductive layer in FIG. 9A.
Figure 9C:
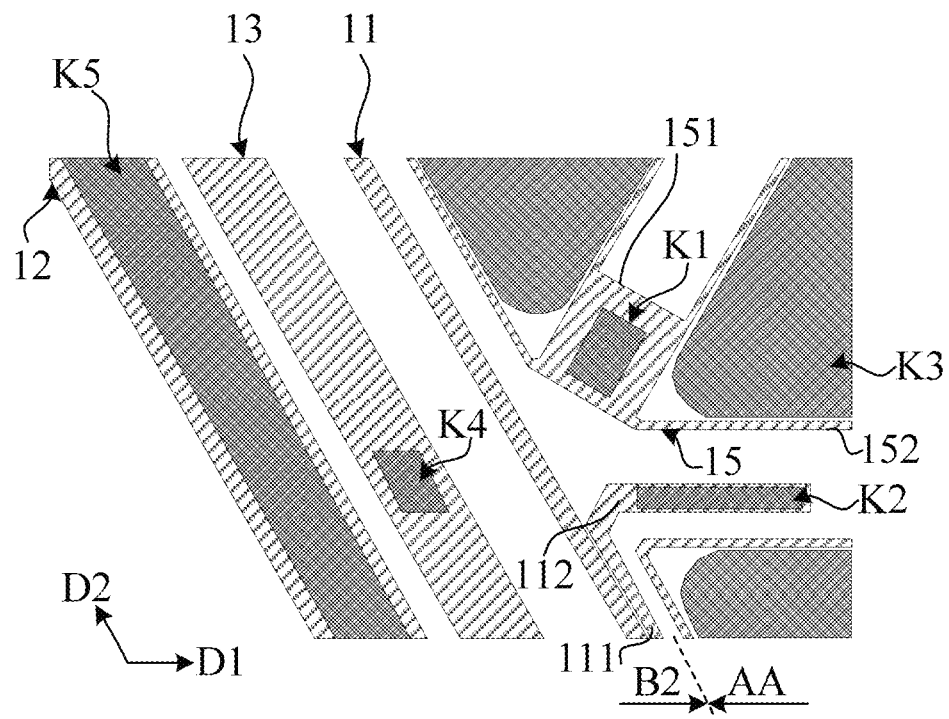
FIG. 9C is a schematic view of a light emitting substrate after formation of a first insulating layer in FIG. 9A.
Figure 9D:
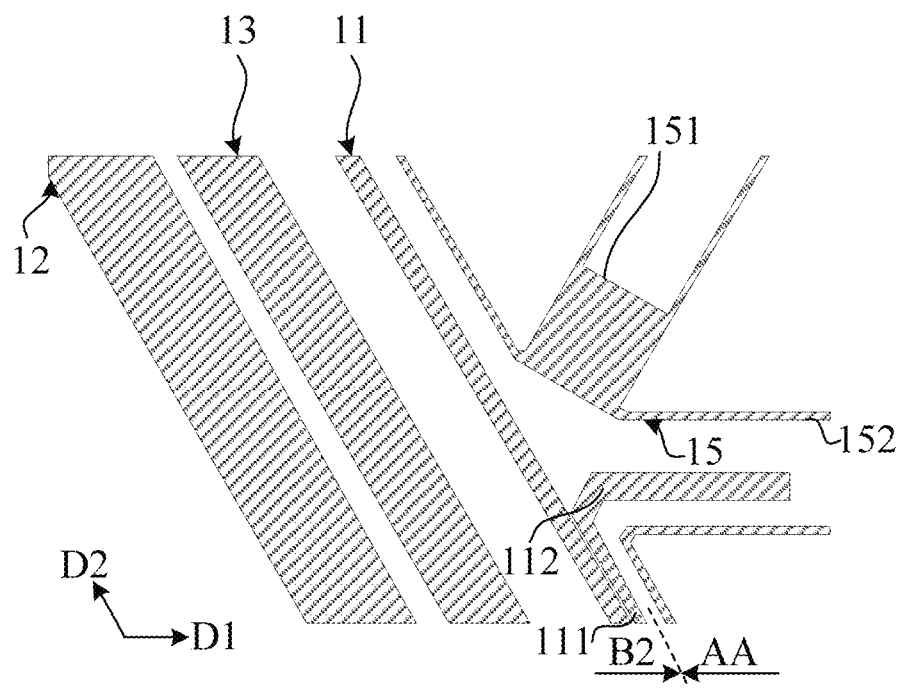
FIG. 9D is a schematic view of a light emitting substrate after formation of a first conductive layer in FIG. 9A.

FIG. 9A is a schematic partially enlarged view of a region S2 in FIG. 1. FIG. 9B is a schematic view of a light emitting substrate after formation of a second conductive layer in FIG. 9A. FIG. 9C is a schematic view of a light emitting substrate after formation of a first insulating layer in FIG. 9A. FIG. 9D is a schematic view of a light emitting substrate after formation of a first conductive layer in FIG. 9A.

In some exemplary implementations, as shown in FIG. 9A to FIG. 9D, a second signal trace 12, a ground trace 13, and a plurality of first signal traces 11 are provided in a bezel region B2 on the left side of the display region AA. As shown in FIG. 9D, the second signal trace 12, the ground trace 13, and the plurality of first signal traces 11 may be arranged sequentially along a side close to the display region AA in the first direction D1. The second signal trace 12, the ground trace 13, and the first signal traces 11 may all be located in the first conductive layer. The second extension portion 111 of the first signal trace 11 may be located in the bezel region B2 and the second connection portion 112 may extend into the display region AA so as to be electrically connected to the light emitting element.

In some examples, as shown in FIG. 9C, the first insulating layer of the bezel region B2 may be provided with a third opening K4 and a second groove K5. The first insulating layer in the third opening K4 may be removed to expose a surface of the ground trace 13. The first insulating layer in the second groove K5 is removed to expose a surface of the second signal trace 12. The second groove K5 may be a continuous groove in the bezel region B2. The second electrode of the light emitting element may extend to the bezel region B2 and is electrically connected to the second signal trace 12 through the second groove K5. However, the embodiment is not limited thereto. In some other examples, the bezel region B2 may be provided with a plurality of separate second grooves K5 which may expose, sectionally, a surface of the ground trace 13.

In some examples, as shown in FIG. 9A and FIG. 9B, the light emitting substrate may also include a second connection electrode 17. The second connection electrode 17 may be located in a second conductive layer. One end of the second connection electrode 17 may extend to the display region AA and is electrically connected to the first connection portion 151 of the anti-static trace 15 in the display region AA through the first opening K1, and the other end of the second connection electrode 17 may be located in the bezel region B2 and is electrically connected to the ground trace 13 through the third opening K4. An orthographic projection of the second connection electrode 17 on the base substrate 200 may be V-shaped. However, the embodiment is not limited thereto. An electrical connection between the anti-static trace 15 and the ground trace 13 may be realized in the bezel regions B2 on the left and right sides of the display region AA through the second connection electrode 17.

Figure 10A:
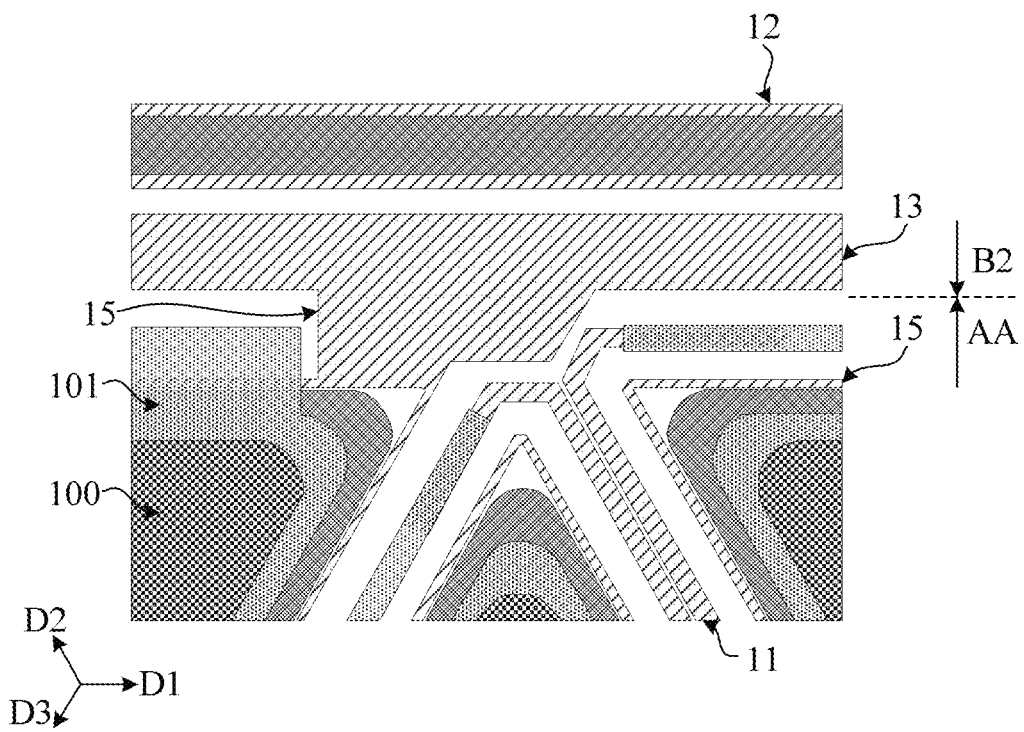
FIG. 10A is a schematic partially enlarged view of a region S3 in FIG. 1.
Figure 10B:
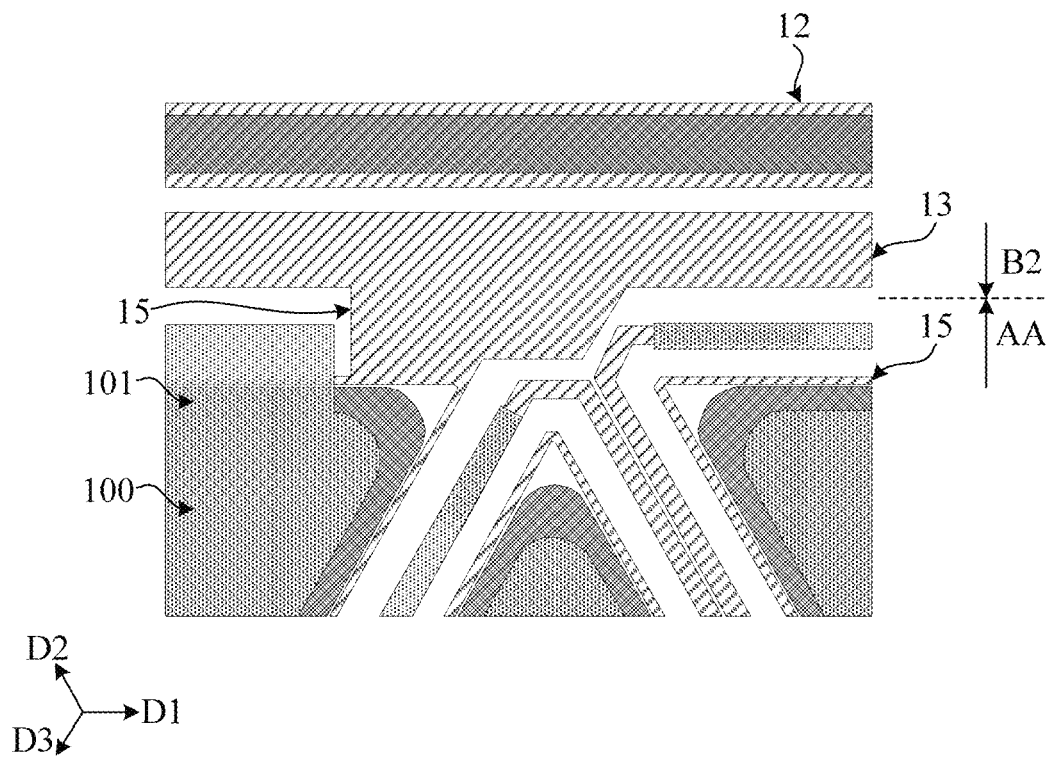
FIG. 10B is a schematic view of a light emitting substrate after formation of a second conductive layer in FIG. 10A.
Figure 10C:
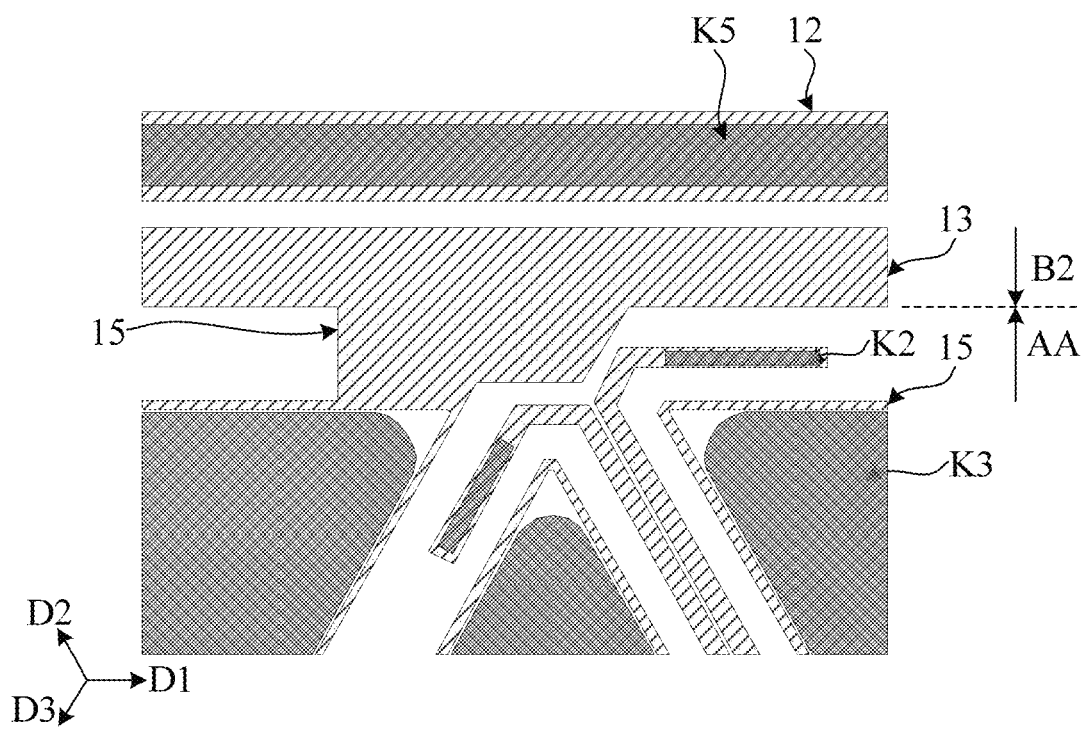
FIG. 10C is a schematic view of a light emitting substrate after formation of a first insulating layer in FIG. 10A.
Figure 10D:
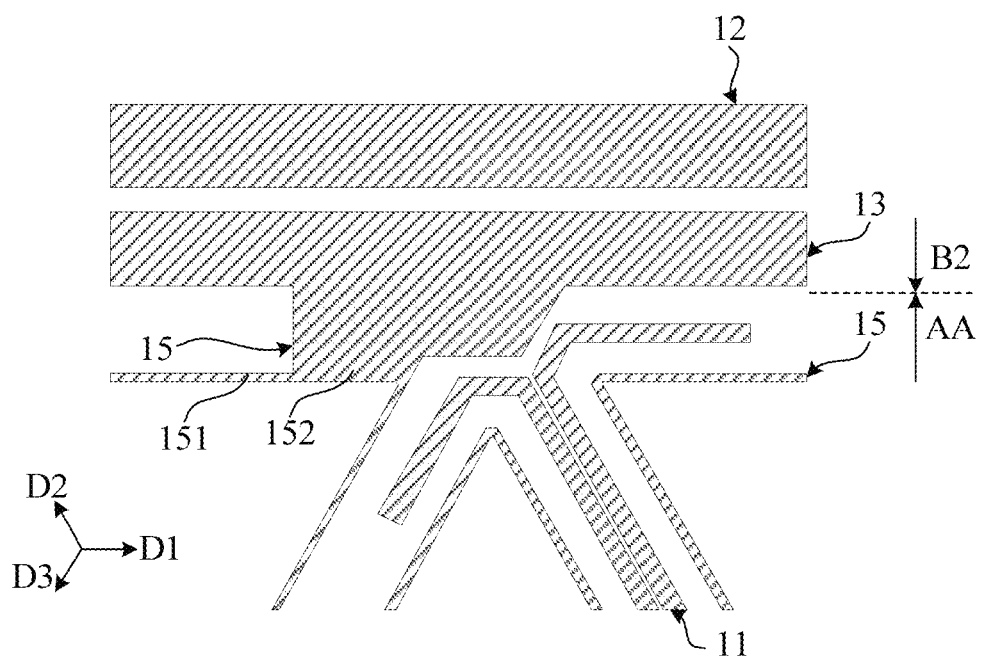
FIG. 10D is a schematic view of a light emitting substrate after formation of a first conductive layer in FIG. 10A.

FIG. 10A is a schematic partially enlarged view of a region S3 in FIG. 1. FIG. 10B is a schematic view of a light emitting substrate after formation of a second conductive layer in FIG. 10A. FIG. 10C is a schematic view of a light emitting substrate after formation of a first insulating layer in FIG. 10A. FIG. 10D is a schematic view of a light emitting substrate after formation of a first conductive layer in FIG. 10A.

In some exemplary implementations, as shown in FIG. 10A to FIG. 10D, the second signal trace 12 and the ground trace 13 arranged in the bezel region B2 on the upper side of the display region AA may extend in the first direction D1. As shown in FIG. 10D, the ground trace 13 in the bezel region B2 on the upper side of the display region AA and the first connection portion 152 of at least one anti-static trace 15 in the display region AA may constitute an integrated structure. As shown in FIG. 10C, the second groove K5 provided in the first insulating layer of the bezel region B2 on the upper side of the display region AA may communicate with the second grooves K5 on the left and right sides. For other structures on the upper side bezel region, reference may be made to the above relevant descriptions, which will not be repeated here.

Exemplary description is made below for a preparation process of a light emitting substrate. A "patterning process" mentioned in the present disclosure includes coating with a photoresist, mask exposure, development, etching, photoresist stripping, and other treatments for a metal material, an inorganic material, or a transparent conductive material, and includes coating with an organic material, mask exposure, development, and other treatments for an organic material. Deposition may be any one or more of sputtering, evaporation, and chemical vapor deposition. Coating may be any one or more of spray coating, spin coating, and ink-jet printing. Etching may be any one or more of dry etching and wet etching, which is not limited in the present disclosure. A "thin film" refers to a layer of thin film manufactured by a certain material on a base substrate through deposition, coating, or other processes. If the "thin film" does not need a patterning process in an entire manufacturing process, the "thin film" may also be called a "layer". If the "thin film" needs a patterning process in an entire manufacturing process, it is called a "thin film" before the patterning process, and called a "layer" after the patterning process. The "layer" after the patterning process includes at least one "pattern". In an exemplary embodiment of the present disclosure, "an orthographic projection of A includes an orthographic projection of B" refers to that a boundary of the orthographic projection of B falls within a range of a boundary of the orthographic projection of A, or the boundary of the orthographic projection of A is overlapped with the boundary of the orthographic projection of B.

In some exemplary implementations, a preparation process of a light emitting substrate may include following operations.

(1) A base substrate is provided.

In some exemplary implementations, the base substrate 200 may be a rigid substrate, e.g., a glass substrate. However, the embodiment is not limited thereto. In some other examples, the base substrate 200 may be a flexible substrate. For example, the base substrate may include a flexible base and a buffer layer stacked on the flexible base. The buffer layer may be used for improving water resistance of the base substrate. For example, the flexible base may be made of a material such as polyimide (PI), polyethylene terephthalate (PET), or a surface-treated polymer soft film, and the buffer layer may be made of an inorganic material, for example, may be made of any one or more of silicon oxide (SiOx), silicon nitride (SiNx), and silicon oxynitride (SiON), and may be of single-layer, multi-layer, or composite-layer.

(2) A first conductive layer is formed.

In some exemplary implementations, a first conductive thin film is deposited on the base substrate 200 on which the aforementioned structure is formed, and the first conductive thin film is patterned through a patterning process to form a first conductive layer 21. As shown in FIG. 5D, FIG. 6D, FIG. 9D and FIG. 10D, the first conductive layer 21 may include: a plurality of first signal traces 11, a second signal trace 12, a ground trace 13, a plurality of anti-static traces 15, and a plurality of bonding pins. The plurality of bonding pins may be located in the bonding region, the ground trace 13 and the second signal trace 12 may be located in the peripheral region BB, and the anti-static trace 15 may be located in the display region AA.

In some exemplary implementations, the first conductive layer 21 may be made of a transparent conductive material, which, for example, may include indium tin oxide (ITO); or may be made of a metal material, e.g., any one or more of silver (Ag), copper (Cu), aluminum (Al), and molybdenum (Mo), or an alloy material of the above metals, such as an aluminum neodymium alloy (AlNd) or a molybdenum niobium alloy (MoNb), which may be a single-layered structure or a multi-layered composite structure, such as Ti/Al/Ti, etc.

(3) A first insulating layer is formed.

In some exemplary implementations, a first insulating thin film is deposited on the base substrate 200 on which the aforementioned structures are formed, and the first insulating thin film is patterned through a patterning process to form a first insulating layer 201. As shown in FIG. 5C, FIG. 6C, FIG. 9C and FIG. 10C, the first insulating layer 201 may be provided with a plurality of openings and grooves, which, for example, may include a first opening K1, a second opening K2 and a first groove K3 located in the display region AA, and a third opening K4 and a second groove K5 located in the bezel region B2.

In some exemplary implementations, the first insulating layer may be made of any one or more of silicon oxide (SiOx), silicon nitride (SiNx) and silicon oxynitride (SiON), and may be of single-layer, multi-layer or composite-layer.

(4) A second conductive layer is formed.

In some exemplary implementations, a second conductive thin film is deposited on the base substrate 200 on which the aforementioned structures are formed, and the second conductive thin film is patterned through a patterning process to form a second conductive layer 22. As shown in FIG. 5B, FIG. 6B, FIG. 9B and FIG. 10B, the second conductive layer 22 may include: a plurality of first connection electrodes 16, a plurality of second connection electrodes 17, and first electrodes 101 of a plurality of the light emitting elements. The first electrodes 101 of the plurality of light emitting elements and the plurality of first connection electrodes 16 may be located in the display region. The plurality of second connection electrodes 17 may extend from the bezel region B2 to the display region AA.

(5) A pixel definition layer is formed.

In some exemplary implementations, a pixel definition thin film is coated on the base substrate 200 on which the aforementioned patterns are formed, and a pixel definition layer 104 is formed through masking, exposure, and development processes. As shown in FIG. 5A, FIG. 6A, FIG. 9A and FIG. 10A, the pixel definition layer 104 may have a plurality of pixel openings 100 exposing the second conductive layer 22. The plurality of pixel openings 100 may be located in the display region AA. In some examples, the pixel definition layer 104 may be made of an organic material such as polyimide, acrylic, or polyethylene terephthalate.

(6) An organic light emitting layer is formed.

In some exemplary implementations, an organic light emitting layer 103 is formed in the previously formed pixel opening, and the organic light emitting layer 103 may be in contact with the first electrode 101 of the light emitting layer. In some examples, a hole injection layer and a hole transport layer are formed by sequential evaporation using an Open Mask on the base substrate 200 on which the aforementioned patterns are formed, then a blue light emitting layer, a green light emitting layer and a red light emitting layer are formed by sequential evaporation using FMM, and then an electron transport layer and an electron injection layer are formed by sequential evaporation using an open mask. In this example, the light emitting element may emit white light. However, the embodiment is not limited thereto.

(7) A third conductive layer is formed.

In some exemplary implementations, a third conductive thin film is deposited on the base substrate 200 on which the aforementioned patterns are formed, and the third conductive thin film is patterned through a patterning process to form a third conductive layer 23. The third conductive layer 23 may include second electrodes 102 of a plurality of light emitting elements. The second electrodes 102 of the plurality of light emitting elements may constitute an integrated structure. The second electrode 102 may be formed on the pixel definition layer 104 and in contact with the organic light emitting layer 103 of the light emitting element. The second electrode 102 may be electrically connected to the second signal trace 12 in the bezel region B2.

(8) An encapsulation layer is formed.

In some exemplary implementations, an encapsulation layer is formed on the third conductive layer 23. The encapsulation layer may include an inorganic material/organic material/inorganic material stack structure. However, the embodiment is not limited thereto. In some other examples, encapsulation of the light emitting element may be realized in a Filter manner.

In some exemplary implementations, the second conductive layer 22 may be made of a transparent conductive material, which, for example, may include indium tin oxide (ITO). The third conductive layer 23 may be made of a reflective material such as a metal, for example, silver (Ag). The light emitting substrate in this example may be a bottom emission structure, i.e., the light emitting substrate emits light from the side of the base substrate 200. However, the embodiment is not limited thereto. In some other examples, the light emitting substrate in this example may be a top emission structure, i.e., the light emitting substrate emits light from a side away from the base substrate. The second conductive layer may be made of a reflective material such as a metal, and the third conductive layer may be made of a transparent conductive material.

For the illumination display required by the light emitting substrate in this example, there is no necessity to control the light emitting element through a complicated pixel circuit, instead, drive of the light emitting element is realized by leading out a drive signal through a first signal trace and a second signal trace. The light emitting substrate in this example may utilize the first conductive layer and the second conductive layer to realize anti-static traces of a mesh structure, which may skillfully divide the light emitting element and improve the anti-static function. Moreover, by arranging the ground trace between the first signal trace and the second signal trace, the first signal trace and the second signal trace may be effectively isolated and heat-dissipated.

An embodiment of the present disclosure also provides a method for preparing a light emitting substrate, including: forming at least one anti-static trace in a display region of a base substrate, and forming a ground trace in a peripheral region on at least one side of the display region; and forming at least one light emitting element in the display region, wherein the ground trace is electrically connected to the at least one anti-static trace and the anti-static trace is configured to surround the at least one light emitting element.

For the method for preparing the light emitting substrate in the embodiment, reference may be made to the descriptions of the above-mentioned embodiments, which thus will not be repeated here.

An embodiment of the present disclosure further provides a light emitting apparatus, including the light emitting substrate described above.

In some exemplary implementations, the light emitting apparatus may further include: a connection unit and a drive circuit board. The connection unit may include at least one second ground pin, and the drive circuit board may include a third ground pin. The second ground pin is electrically connected to the first ground pin of the bonding region of the light emitting substrate and may also be electrically connected to the third ground pin of the drive circuit board.

Figure 11:
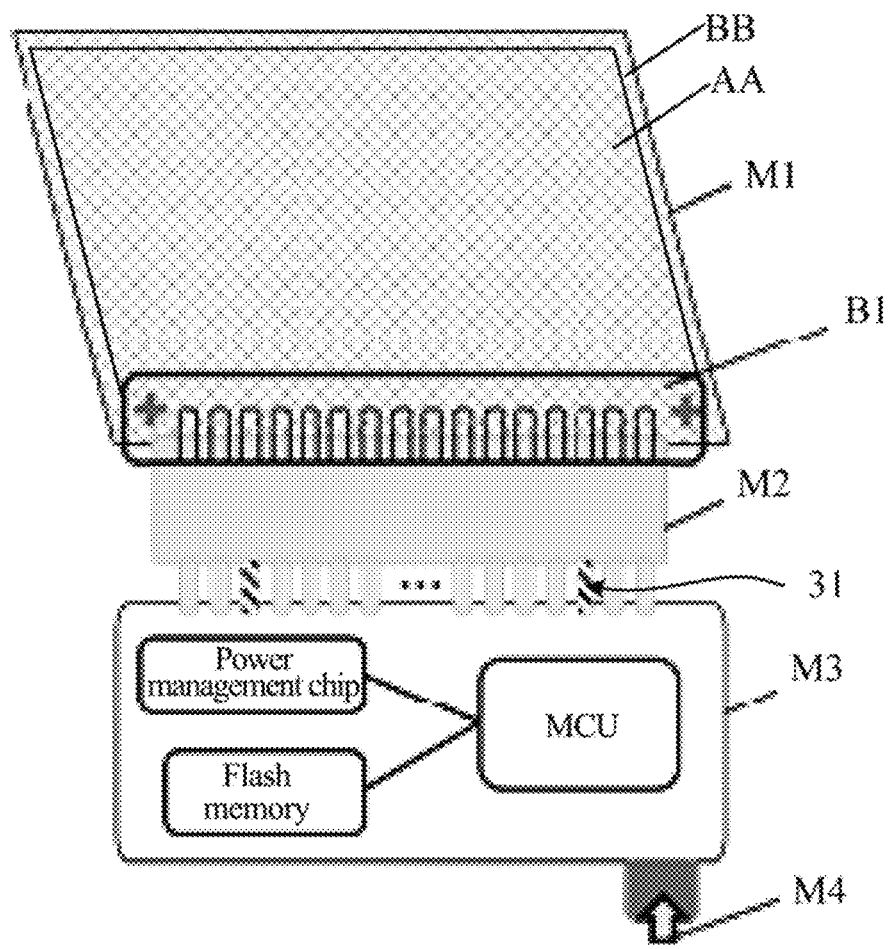
FIG. 11 is a schematic view of a light emitting apparatus according to at least one embodiment of the present disclosure.

FIG. 11 is a schematic view of a light emitting apparatus according to at least one embodiment of the present disclosure. In some exemplary implementations, as shown in FIG. 11, the light emitting apparatus may include: a light emitting substrate M1, a connection unit M2, a drive circuit board M3 and a power interface M4. In some examples, the connection unit M2 may be a Flexible Printed Circuit (FPC). The drive circuit board M3 may include: a microprocessor (MCU, Microcontroller Unit), a power chip (Power IC), and a flash memory (Flash). The flash memory may be built-in with customized graphics. The microprocessor may be electrically connected with the power chip and the flash memory, and may control the power chip and the flash memory through a plurality of input/output interfaces to drive the light emitting substrate M1 and realize the illumination function of the light emitting substrate M1.

In some examples, as shown in FIG. 11, the light emitting substrate M1 may include: a display region AA and a peripheral region BB surrounding the display region AA. The peripheral region BB includes: a bonding region B1 located on a side of the display region AA. The bonding region B1 is provided with a plurality of bonding pins. The plurality of bonding pins of the bonding region B1 may include: at least one first ground pin. The connection unit M2 may include at least one (e.g., two) second ground pins 31. The second ground pin 31 of the connection unit M2 may be in bonding connection to the first ground pin of the bonding region B1 of the light emitting substrate M1. The drive circuit board M3 may include a third ground pin. The second ground pin 31 of the connection unit M2 may be electrically connected to the third ground pin of the drive circuit board M3. The third ground pin of the drive circuit board M3 is electrically connected with a ground line of the power interface M4. In this example, the first ground pin of the light emitting substrate M1 is electrically connected with the ground line of the power interface M4 through the connection unit and the drive circuit board, which may realize a complete connection to the ground, and may directly discharge a large amount of instantaneous electrostatic charges generated by electrostatic discharge in the light emitting substrate M1 to the ground line, thereby enhancing the anti-static capability, improving the breakdown resistance of the light emitting substrate under high-strength ESD conditions, and further meeting the requirements of automotive-grade products.

In some exemplary implementations, the light emitting substrate may be a flexible OLED display substrate or a QLED display substrate. The light emitting apparatus may be any vehicle-mounted product or component with a display function, such as car lights, vehicle-mounted light emitting devices, navigators, etc. By using the light emitting apparatus of the embodiment, the A-level discharge protection requirement of the automotive-grade product may be met, and good stability may be achieved in electrostatic discharge protection, which leads to a wide application prospect.

The drawings of the present disclosure only relate to structures involved in the present disclosure, and for other structures, reference may be made to conventional designs. The embodiments of the present disclosure and features in the embodiments may be combined to each other to obtain new embodiments if there is no conflict. Those of ordinary skills in the art should understand that modifications or equivalent replacements may be made to the technical solutions of the present disclosure without departing from the spirit and scope of the technical solutions of the present disclosure, which shall all fall within the scope of the claims of the present disclosure.

The invention claimed is:

1. A light emitting substrate, comprising:
   a base substrate, comprising a display region and a peripheral region located on at least one side of the display region;
   at least one light emitting element, located in the display region;
   at least one anti-static trace, located in the display region, the at least one anti-static trace being configured to surround the at least one light emitting element; and
   a ground trace, located in the peripheral region, the ground trace being electrically connected with the at least one anti-static trace;
   wherein adjacent anti-static traces in the display region constitute an integrated structure, or the adjacent anti-static traces in the display region are electrically connected through a first connection electrode; and
   the anti-static trace comprises: a first extension portion and a first connection portion connected to each other, wherein an orthographic projection of the first extension portion on the base substrate is annular; the first connection portion of the anti-static trace and a first connection portion of another anti-static trace constitute an integrated structure, or the first connection portion of the anti-static trace is electrically connected with a first connection portion of another anti-static trace through the first connection electrode.

2. The light emitting substrate according to claim 1, wherein the at least one anti-static trace constitutes a mesh structure, the mesh structure comprises at least one mesh, and the at least one mesh surrounds the at least one light emitting element.

3. The light emitting substrate according to claim 1, wherein the first connection electrode is located on a side of the anti-static trace away from the base substrate.

4. The light emitting substrate according to claim 1, wherein the ground trace is electrically connected to the at least one anti-static trace through a second connection electrode.

5. The light emitting substrate according to claim 4, wherein the ground trace and the anti-static trace are of a same layer structure, and the second connection electrode is located on a side of the ground trace away from the base substrate.

6. The light emitting substrate according to claim 1, wherein an orthographic projection of a portion for emitting light of the light emitting element on the base substrate is triangular.

7. A light emitting apparatus, comprising the light emitting substrate according to claim 1.

8. The light emitting apparatus according to claim 7, further comprising: a connection unit and a drive circuit board, wherein the connection unit comprises at least one second ground pin, and the drive circuit board comprises a third ground pin; the second ground pin is electrically connected to a first ground pin in a bonding region of the light emitting substrate and also electrically connected to the third ground pin of the drive circuit board.

9. A method for preparing a light emitting substrate, used for preparing the light emitting substrate according to claim 1, comprising:
   forming the at least one anti-static trace in the display region of the base substrate, and forming the ground trace in the peripheral region on at least one side of the display region; and
   forming the at least one light emitting element in the display region, wherein the ground trace is electrically connected to the at least one anti-static trace, and the anti-static trace is configured to surround the at least one light emitting element.

10. A light emitting substrate, comprising:
    a base substrate, comprising a display region and a peripheral region located on at least one side of the display region;
    at least one light emitting element, located in the display region;
    at least one anti-static trace, located in the display region, the at least one anti-static trace being configured to surround the at least one light emitting element; and
    a ground trace, located in the peripheral region, the ground trace being electrically connected with the at least one anti-static trace;
    wherein the display region is further provided with a pixel definition layer having at least one pixel opening, and a portion of the light emitting element located at the pixel opening is used for emitting light; and an orthographic projection of the pixel definition layer on the base substrate covers an orthographic projection of the anti-static trace on the base substrate;
    the light emitting element comprises: a first electrode, a second electrode, and an organic light emitting layer arranged between the first electrode and the second electrode; and
    the first electrode is located on a side of the organic light emitting layer close to the base substrate, the pixel opening of the pixel definition layer exposes at least a portion of the first electrode, the organic light emitting layer is in contact with the first electrode through the pixel opening, the second electrode is located on a side of the organic light emitting layer away from the base substrate, and the second electrode is in contact with the organic light emitting layer.

11. The light emitting substrate according to claim 10, further comprising: at least one first signal trace and at least one second signal trace, wherein the first signal trace extends from the peripheral region to the display region and is electrically connected to the first electrode of the at least one light emitting element; and the second signal trace is located in the peripheral region and is electrically connected to the second electrode of the at least one light emitting element.

12. The light emitting substrate according to claim 11, wherein in the display region, the anti-static trace is located between the first signal trace and the light emitting element.

13. The light emitting substrate according to claim 11, wherein in the peripheral region, the ground trace is located between the second signal trace and the first signal trace.

14. The light emitting substrate according to claim 11, further comprising: a first conductive layer located on a side of the at least one light emitting element close to the base substrate, wherein the first signal trace, the second signal trace, the anti-static trace and the ground trace are all located in the first conductive layer.

15. The light emitting substrate according to claim 14, further comprising: a first insulating layer located between the light emitting element and the first conductive layer, wherein an orthographic projection of the first insulating layer on the base substrate is not overlapped with an orthographic projection of a portion for emitting light of the at least one light emitting element on the base substrate.

16. The light emitting substrate according to claim 11, wherein the peripheral region comprises: a bonding region located on a side of the display region, the bonding region comprises:

at least one first ground pin, at least one first signal pin and at least one second signal pin; the first ground pin is electrically connected to the ground trace, the first signal pin is electrically connected to the first signal trace, and the second signal pin is electrically connected to the second signal trace; and the first ground pin is located between the first signal pin and the second signal pin.

17. The light emitting substrate according to claim 10, wherein a material of the first electrode of the light emitting element comprises a transparent conductive material, and a material of the second electrode comprises a metal material.

* * * * *